(12) United States Patent
Gao et al.

(10) Patent No.: US 12,389,685 B2
(45) Date of Patent: Aug. 12, 2025

(54) ARRAY SUBSTRATE, METHOD FOR PREPARING ARRAY SUBSTRATE, DISPLAY PANEL, AND DISPLAY DEVICE

(71) Applicant: Xiamen Tianma Microelectronics Co., Ltd., Xiamen (CN)

(72) Inventors: Jiao Gao, Xiamen (CN); Yingzhang Qiu, Xiamen (CN)

(73) Assignee: Xiamen Tianma Microelectronics Co., Ltd., Xiamen (CN)

(*) Notice: Subject to any disclaimer, the term of this patent is extended or adjusted under 35 U.S.C. 154(b) by 61 days.

(21) Appl. No.: 18/010,261

(22) PCT Filed: Dec. 17, 2021

(86) PCT No.: PCT/CN2021/139027
§ 371 (c)(1),
(2) Date: Dec. 14, 2022

(87) PCT Pub. No.: WO2023/273209
PCT Pub. Date: Jan. 5, 2023

(65) Prior Publication Data
US 2024/0243135 A1    Jul. 18, 2024

(30) Foreign Application Priority Data
Jun. 30, 2021    (CN) .......................... 202110739102.5

(51) Int. Cl.
*G09G 3/36*    (2006.01)
*H10D 86/01*    (2025.01)
(Continued)

(52) U.S. Cl.
CPC .......... *H10D 86/60* (2025.01); *H10D 86/021* (2025.01); *H10D 86/441* (2025.01); *H10D 86/451* (2025.01)

(58) Field of Classification Search
CPC ............. G09G 3/2092; H10K 59/1201; H10K 59/131; H10K 59/38; H10K 77/10; H10D 30/6723; H10D 86/201; H10D 86/441
See application file for complete search history.

(56) References Cited

U.S. PATENT DOCUMENTS 5,250,931 A * 10/1993 Misawa ................. G09G 3/002
                                                              345/206
5,926,702 A *  7/1999 Kwon ................ H10D 30/6723
                                                              438/149
(Continued)

FOREIGN PATENT DOCUMENTS

CN       103389605 A     11/2013
CN       105319792 A      2/2016
(Continued)

OTHER PUBLICATIONS

International Search Report and Written Opinion dated Mar. 16, 2022, for application No. PCT/CN2021/139027 (10 pages).

*Primary Examiner* — Joe H Cheng
(74) *Attorney, Agent, or Firm* — KDW FIRM PLLC

(57) ABSTRACT

Provided an array substrate, as well as a method for preparing an array substrate, a display panel, and a display device, includes: substrate; driver circuits located on side of the substrate; signal lead-out structure located on side of the driver circuits facing away from the substrate and including insulating boss and signal lead-out wires one of which electrically connected to an output electrode of a driver circuit, and at least part of the signal lead-out wire extends along sidewall of the insulating boss; a color-resist layer located on side of the driver circuits facing away from the substrate and surrounding sidewall of the signal lead-out structure, and thickness of the color-resist layer less than or equal to extension length of the signal lead-out wire; and a first electrode located on side of the signal lead-out structure (Continued)

facing away from the substrate and electrically connected to the signal lead-out wire.

20 Claims, 29 Drawing Sheets

(51) Int. Cl.
*H10D 86/40* (2025.01)
*H10D 86/60* (2025.01)

(56) References Cited

U.S. PATENT DOCUMENTS

| | | | | |
|---|---|---|---|---|
| 6,362,030 | B1* | 3/2002 | Nagayama | G02F 1/13454 |
| | | | | 438/149 |
| 6,492,659 | B1* | 12/2002 | Yamazaki | H10D 30/0321 |
| | | | | 257/349 |
| 6,531,713 | B1* | 3/2003 | Yamazaki | H10D 30/0321 |
| | | | | 257/E29.279 |
| 7,202,927 | B2* | 4/2007 | Murade | G02F 1/133345 |
| | | | | 349/138 |
| 8,779,296 | B2* | 7/2014 | Katsui | G02F 1/136286 |
| | | | | 174/250 |
| 8,878,185 | B2* | 11/2014 | Ishigaki | H01L 21/288 |
| | | | | 438/149 |

FOREIGN PATENT DOCUMENTS

| | | |
|---|---|---|
| CN | 111474774 A | 7/2020 |
| CN | 111696919 A | 9/2020 |
| CN | 113451335 A | 9/2021 |

\* cited by examiner

ARRAY SUBSTRATE, METHOD FOR PREPARING ARRAY SUBSTRATE, DISPLAY PANEL, AND DISPLAY DEVICE

CROSS-REFERENCE TO RELATED APPLICATION(S)

This is a national stage application filed under 37 U.S.C. 371 based on International Patent Application No. PCT/CN2021/139027, filed Dec. 17, 2021, which claims priority to Chinese Patent Application No. 202110739102.5 filed Jun. 30, 2021, the disclosures of which are incorporated herein by reference in their entireties.

TECHNICAL FIELD

The present disclosure relates to the field of display technologies, for example, an array substrate, a method for preparing an array substrate, a display panel, and a display device.

BACKGROUND

To meet the demand for comfort and entertainment, there is a trend of large curved screens on the display. For a display device with a large curved screen, due to the design of a color-resist layer having high film thickness, there are problems in that it is difficult to drill a via-hole, that color-resist residues in the via-hole, that wires are prone to be broken during metal climbing, and etc., which affect the process yield and further affect the display effect.

SUMMARY

The present disclosure provides an array substrate, a method for preparing an array substrate, a display panel, and a display device, thus achieving the amelioration of problems in that it is difficult to drill a via-hole, that color-resist residues in the via-hole, that wires are prone to be broken during metal climbing.

An array substrate is provided, including:
a substrate;
driver circuits located on a side of the substrate, where a driver circuit of the driver circuits includes an output electrode;
a signal lead-out structure located on a side of the driver circuits facing away from the substrate, where the signal lead-out structure includes an insulating boss and signal lead-out wires, a signal lead-out wire of the signal lead-out wires is electrically connected to the output electrode, and at least part of the signal lead-out wire extends along a sidewall of the insulating boss;
a color-resist layer located on the side of the driver circuits facing away from the substrate, where the color-resist layer surrounds a sidewall of the signal lead-out structure, and where in the first direction, the thickness of the color-resist layer is less than or equal to the extension length of the signal lead-out wire, and the first direction is perpendicular to a plane where the substrate is located; and
a first electrode located on a side of the signal lead-out structure facing away from the substrate, where the first electrode is electrically connected to the signal lead-out wire.

A method for preparing an array substrate is further provided, which is used for preparing the above array substrate, and the method includes the following.

A substrate is provided.

Driver circuits are prepared on a side of the substrate, and a driver circuit of the driver circuits includes an output electrode.

A signal lead-out structure is prepared on a side of the driver circuits facing away from the substrate. The signal lead-out structure includes an insulating boss and signal lead-out wires, a signal lead-out wire of the signal lead-out wires is electrically connected to the output electrode, and at least part of the signal lead-out wire extends along a sidewall of the insulating boss.

A color-resist layer is prepared on the side of the driver circuits facing away from the substrate. The color-resist layer surrounds a sidewall of the signal lead-out structure. In the first direction, the thickness of the color-resist layer is less than or equal to the extension length of the signal lead-out wire, and the first direction is perpendicular to a plane where the substrate is located.

A first electrode is prepared on a side of the signal lead-out structure facing away from the substrate, and the first electrode is electrically connected to the signal lead-out wire.

A display panel is further provided, and the display panel includes the array substrate described above.

A display device is further provided, and the display device includes the display panel described above.

DETAILED DESCRIPTION

The solutions of the present disclosure are described hereinafter through embodiments in conjunction with the drawings in embodiments of the present disclosure. The embodiments described below are part, not all of the embodiments of the present disclosure.

Figure 1:
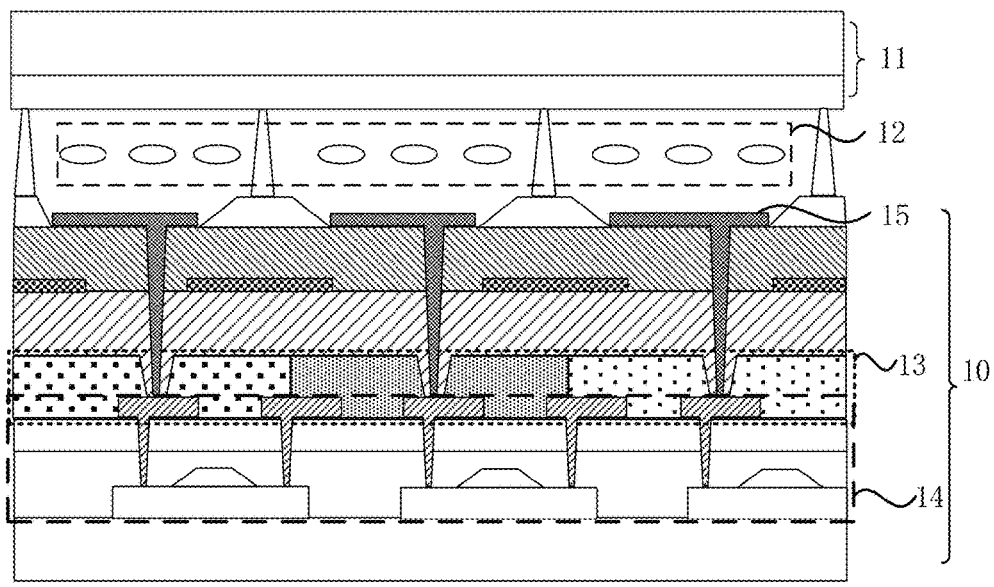
FIG. 1 is a structural diagram of a display panel.

FIG. 1 is a structural diagram of a display panel. As shown in FIG. 1, the display panel includes a first substrate 10 and a second substrate 11 which are oppositely disposed, a display dielectric layer 12 disposed between the first substrate 10 and the second substrate 11, and a color filter structure 13 disposed in the first substrate 10. The color filter structure 13 may include multiple color-resist blocks having different light-emitting colors. The first substrate 10 may also include driver circuits 14, and the driver circuits 14 are configured to provide display signals to pixel electrodes 15, ensuring that the display panel is normally displayed. The driver circuit 14 includes an active layer, a gate, a source, and a drain, and the pixel electrode 15 is electrically connected to the source or the drain of the driver circuit 14 through a via-hole so that the normal transmission of the display signal is achieved. However, the via-hole has to pass through the color filter structure 13 to achieve the electrical connection between the pixel electrode 15 and the driver circuit 14. The process is complex, color-resist residues in the via-hole while preparing the via-hole, and the display effect of the display panel is affected. In case that a color-resist layer is relatively thick, it is necessary to form a deep via-hole in the color-resist layer, which can easily cause problems such as that wires are prone to be broken during metal climbing, and the normal display of the display panel is seriously affected.

To solve the above technical problems, embodiments of the present disclosure provide an array substrate. The array substrate include a substrate: driver circuits located on a side of the substrate, where a driver circuit of the driver circuits includes an output electrode: a signal lead-out structure located on a side of the driver circuits facing away from the substrate, where the signal lead-out structure includes an insulating boss and signal lead-out wires, a signal lead-out wire of the signal lead-out wires is electrically connected to the output electrode, and at least part of the signal lead-out wire extends along a sidewall of the insulating boss: a color-resist layer located on the side of the driver circuits facing away from the substrate, where the color-resist layer surrounds a sidewall of the signal lead-out structure, and where in the first direction, the thickness of the color-resist layer is less than or equal to the extension length of the signal lead-out wire, and the first direction is perpendicular to a plane where the substrate is located; and a first electrode located on a side of the signal lead-out structure facing away from the substrate, where the first electrode is electrically connected to the signal lead-out wire. The signal lead-out structure including the insulating boss and the signal lead-out wires is provided, at least part of the signal lead-out wire extends along the sidewall of the insulating boss, and thus the electrical connection between the output electrode of the driver circuit and the first electrode is achieved. That is, the electrical connection between the output electrode and the first electrode is achieved without through a via-hole in the color-resist layer. Therefore, according to the technical solution of the embodiments of the present disclosure, via-holes are not needed to be drilled in the color-resist layer, which makes the preparing process simple, and makes the display not be affected by in-via residues of color-resist, and also makes the problem of wire breakage during metal climbing not be caused by the excessive depth of the via-hole, ensuring good stability of the connection between the output electrode and the first electrode. The thickness of the color-resist layer is less than or equal to the extension length of the signal lead-out wire, that is, the color-resist layer does not completely cover the signal lead-out wire, and thus the electrical connection between the signal lead-out wire and the first electrode is not affected, ensuring the normal transmission of a display signal and normal display of the display panel.

Technical solutions in embodiments of the present disclosure are described hereinafter in conjunction with drawings in the embodiments of the present disclosure.

Figure 2:
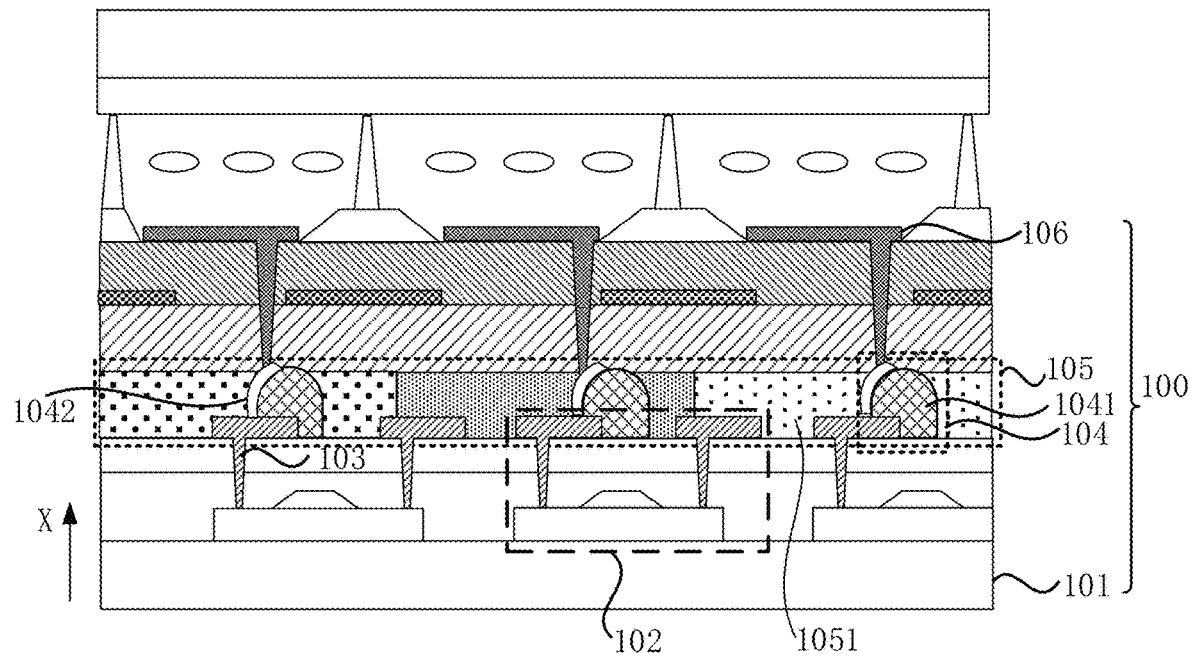
FIG. 2 is a structural diagram of an array substrate according to an embodiment of the present disclosure.
Figure 3:
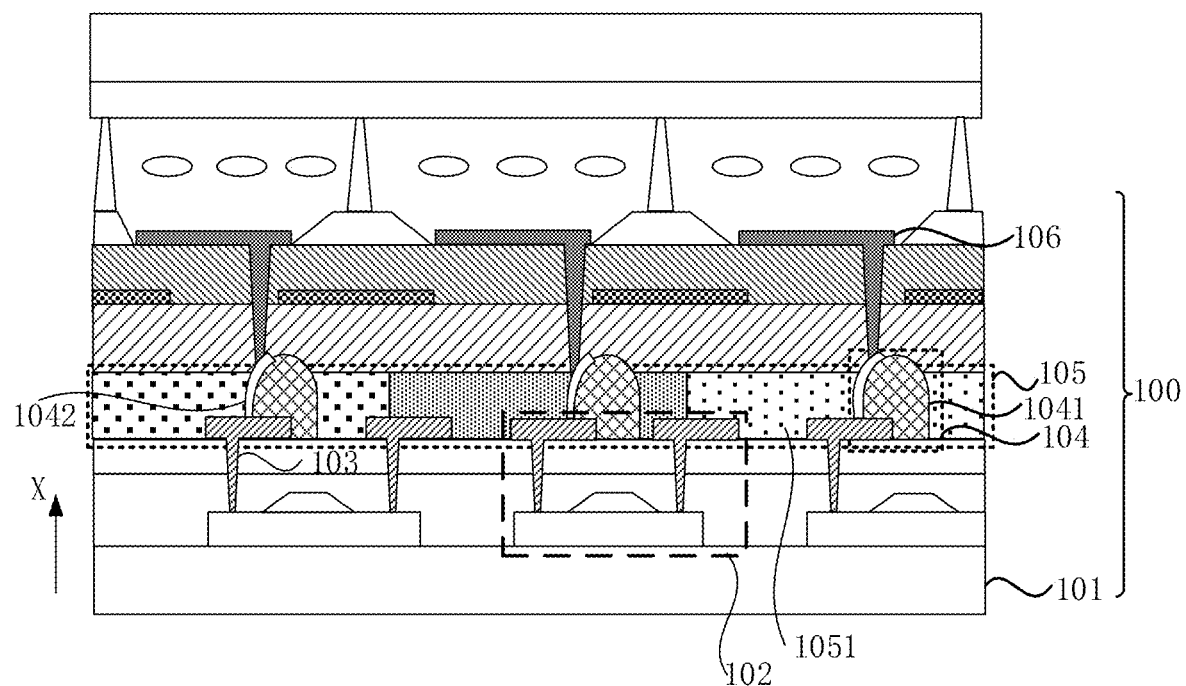
FIG. 3 is another structural diagram of an array substrate according to an embodiment of the present disclosure.

FIG. 2 is a structural diagram of an array substrate according to an embodiment of the present disclosure, and FIG. 3 is another structural diagram of an array substrate according to an embodiment of the present disclosure. As shown in FIGS. 2 and 3, the array substrate 100 provided by the embodiment of the present disclosure includes:

a substrate 101;

driver circuits 102 located on a side of the substrate 101, where a driver circuit 102 includes an output electrode 103;

a signal lead-out structure 104 located on a side of the driver circuits 102 facing away from the substrate 101, where the signal lead-out structure 104 includes an insulating boss 1041 and signal lead-out wires 1042, a signal lead-out wire 1042 is electrically connected to the output electrode 103, and at least part of the signal lead-out wire 1042 extends along a sidewall of the insulating boss 1041;

a color-resist layer 105 located on the side of the driver circuits 102 facing away from the substrate 101, where the color-resist layer 105 surrounds a sidewall of the signal lead-out structure 104, and where in the first direction (the direction X shown in the figure), the thickness of the color-resist layer 105 is less than or equal to the extension length of the signal lead-out wire 1042, and the first direction is perpendicular to a plane where the substrate 101 is located; and a first electrode 106 located on a side of the signal lead-out structure 104 facing away from the substrate 101, where the first electrode 106 is electrically connected to the signal lead-out wire 1042.

The driver circuits 102 are disposed on a side of the substrate 101, and a driver circuit 102 may include a drive transistor for providing a drive signal to a light-emitting unit. The driver circuit 102 includes the output electrode 103, and the output electrode 103 may be a source or a drain, which can be selected according to the actual design requirements and is not limited in embodiments of the present disclosure. The signal lead-out structure 104 is located on the side of the driver circuits 102 facing away from the substrate 101, the color-resist layer 105 is located on the side of the driver circuits 102 facing away from the substrate 101, and the first electrode 106 is located on the side of the signal lead-out structure 104 facing away from the substrate 101, that is, the color-resist layer 105 is disposed on a side of the array substrate, i.e., the color filter on array (COA) technology. The color-resist layer 105 is disposed between a film where the first electrode 106 is located and a film where the output electrode 103 is located, as shown in FIG. 2. In this manner, the light leakage can be ameliorated so that the contrast ratio is increased, and the aperture ratio can be increased at the same time. Due to the color-resist layer 105 located between the film where the first electrode 106 is located and the film where the output electrode 103 is located, in order to avoid drilling a hole in the color-resist layer 105, the signal lead-out structure 104 is added in the embodiments of the present disclosure. The signal lead-out structure 104 includes the insulating boss 1041 and the signal lead-out wires 1042, and at least part of a signal lead-out wire 1042 extends along the sidewall of the insulating boss 1041. The electrical connection between the output electrode 103 and the first electrode 106 is achieved through the insulating boss 1041 and the signal lead-out wires 1042. The color-resist layer 105 is prepared after the signal lead-out structure 104 is prepared, so that there is no need to drill a via-hole in the color-resist layer 105, which makes the preparing process simple, and makes the display not be affected by in-via residues of color-resist, and also makes the problem of wire breakage during metal climbing not be caused by the excessive depth of the via-hole, ensuring good stability of the connection between the output electrode 103 and the first electrode 106.

The insulating boss 1041 may be in a cylindrical shape, a tapered shape, or other shape with a polygonal bottom and a curved sidewall. The shape may be selected according to the actual design requirements and is not limited in the embodiment of the present disclosure. The signal lead-out wires 1042 may be made of a metal having electrical conductivity. At least part of the signal lead-out wire 1042 extends along the sidewall of the insulating boss 1041, facilitating lead-out of the signal lead-out wire 1042 and reducing the risk of wire breakage of the signal lead-out wire 1042. The color-resist layer 105 may include color-resist blocks of at least three different colors, such as a red color-resist block, a green color-resist block, and a blue color-resist block. The color-resist layer 105 surrounds the sidewall of the signal lead-out structure 104, which provides certain fixation and protection to the signal lead-out structure 104. The first electrode 106 may be a pixel electrode or an anode, which is not limited in the embodiment of the present disclosure.

With further reference to FIGS. 2 and 3, in the first direction (the direction X shown in FIGS. 2 and 3), the thickness of the color-resist layer 105 is less than or equal to the extension length of the signal lead-out wire 1042. In FIG. 2, it is illustrated an example in which the thickness of the color-resist layer 105 is equal to the extension length of the signal lead-out wire 1042 in the first direction, and in FIG. 3, it is illustrated an example in which the thickness of the color-resist layer 105 is less than the extension length of the signal lead-out wire 1042 in the first direction, so that the color-resist layer 105 does not completely cover the signal lead-out wire 1042, that is, the color-resist layer 105 does not affect the electrical connection between the signal lead-out wire 1042 and the first electrode 106, ensuring that the connection between the signal lead-out wire 1042 and the first electrode 106 is stable.

The array substrate provided by the embodiment of the present disclosure includes the signal lead-out structure located on the side of the driver circuits facing away from the substrate, the color-resist layer located on the side of the driver circuits facing away from the substrate, and the first electrode located on the side of the signal lead-out structure facing away from the substrate. The signal lead-out structure includes the insulating boss and the signal lead-out wires, and at least part of the signal lead-out wire extends along the sidewall of the insulating boss. The electrical connection between the output electrode of the driver circuit and the first electrode is achieved by using the signal lead-out structure, there is no need to drill a via-hole in the color-resist layer, which makes the preparing process simple, and makes the display not be affected by in-via residues of color-resist, and also makes the problem of wire breakage during metal climbing not be caused by the excessive depth of the via-hole, ensuring good stability of the connection between the output electrode and the first electrode, the normal transmission of the display signal and normal display of the display panel.

Figure 4:
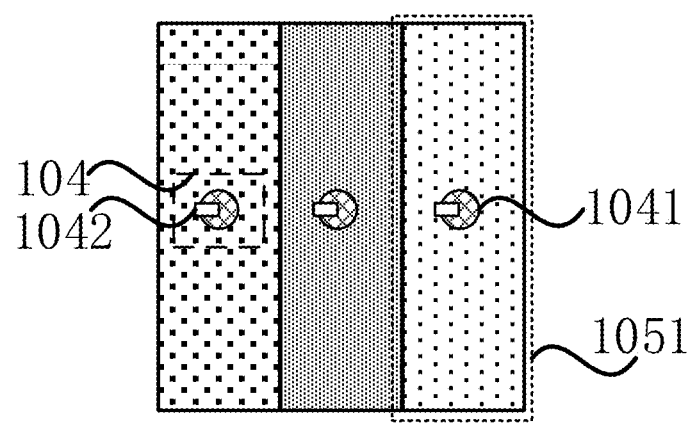
FIG. 4 is another structural diagram of an array substrate according to an embodiment of the present disclosure.
Figure 5:
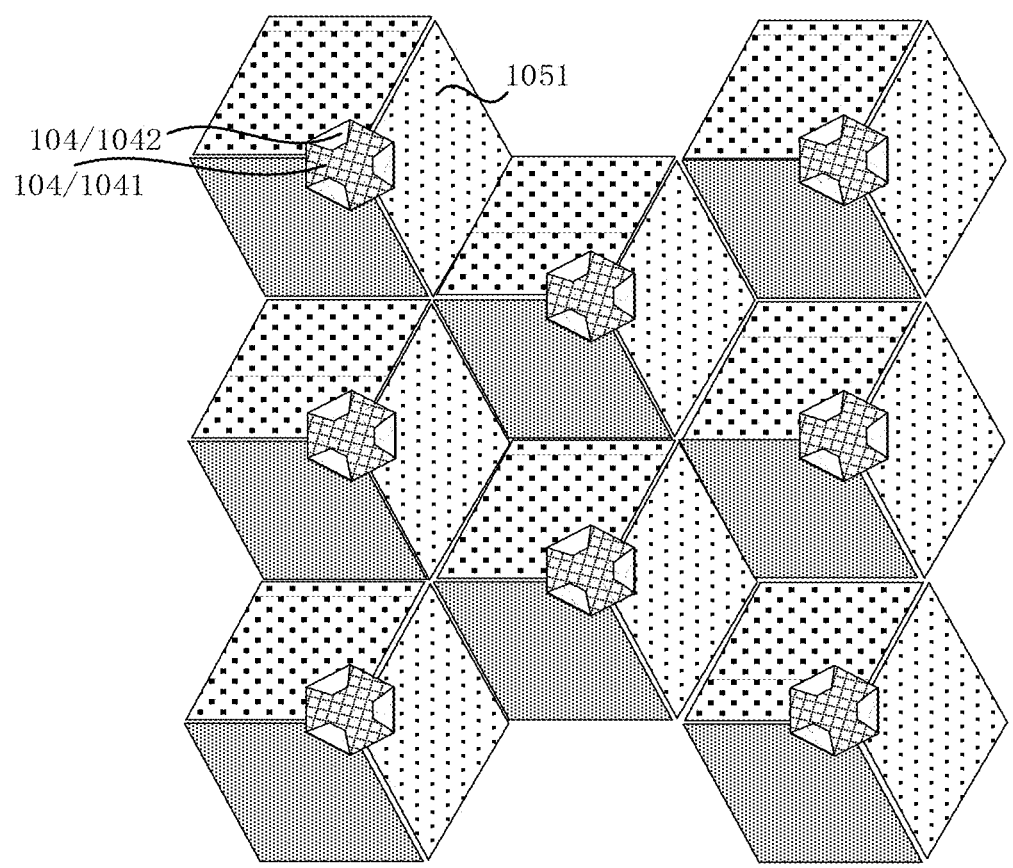
FIG. 5 is another structural diagram of an array substrate according to an embodiment of the present disclosure.
Figure 6:
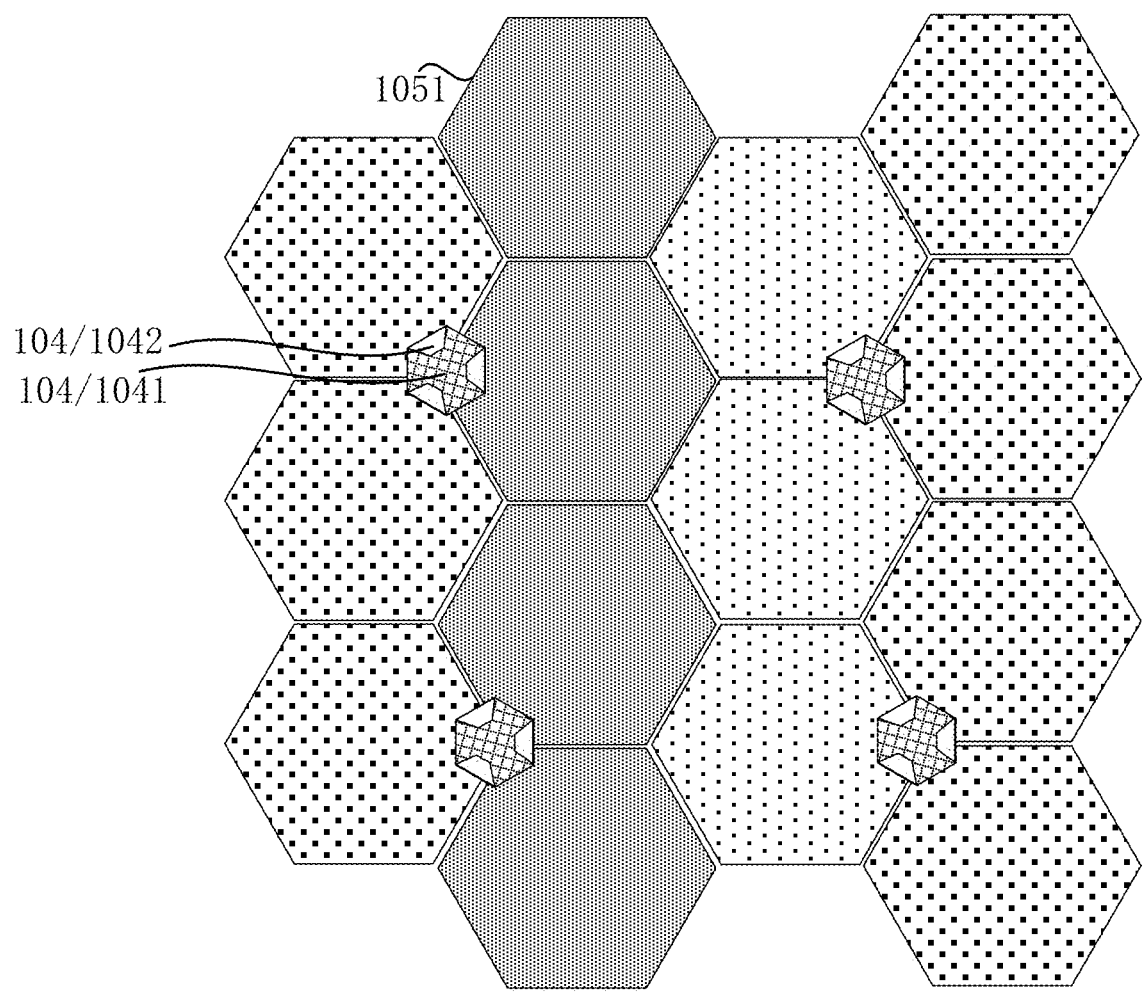
FIG. 6 is another structural diagram of an array substrate according to an embodiment of the present disclosure.
Figure 7:
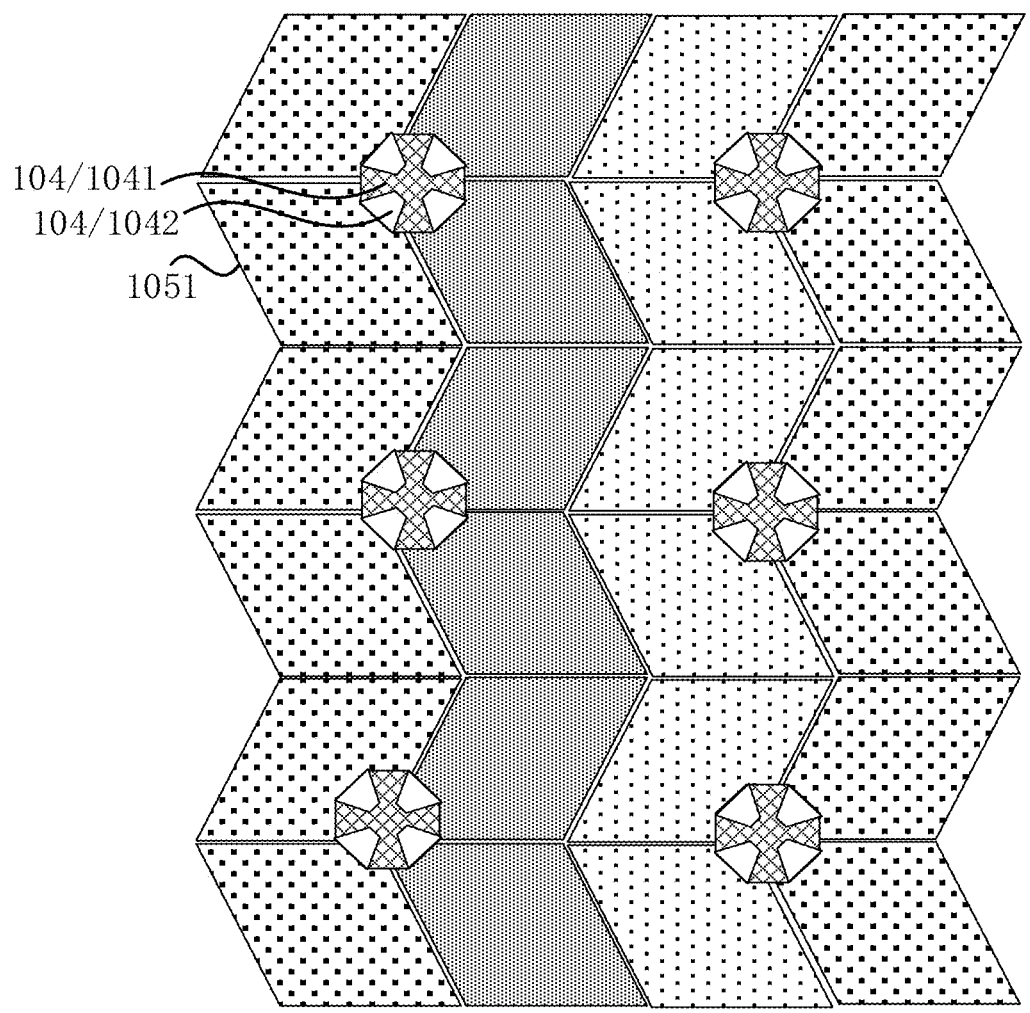
FIG. 7 is another structural diagram of an array substrate according to an embodiment of the present disclosure.
Figure 8:
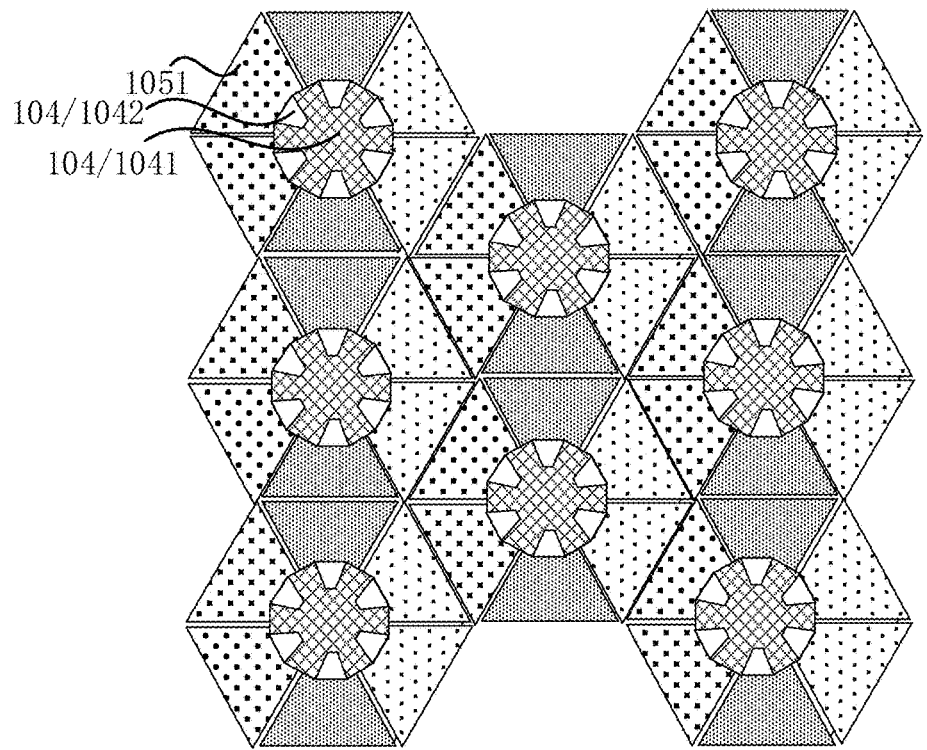
FIG. 8 is another structural diagram of an array substrate according to an embodiment of the present disclosure.

In some embodiments, FIG. 4 is another structural diagram of an array substrate according to an embodiment of the present disclosure, FIG. 5 is another structural diagram of an array substrate according to an embodiment of the present disclosure, FIG. 6 is another structural diagram of an array substrate according to an embodiment of the present disclosure, FIG. 7 is another structural diagram of an array substrate according to an embodiment of the present disclosure, and FIG. 8 is another structural diagram of an array substrate according to an embodiment of the present disclosure. As shown in FIGS. 4 to 8, the color-resist layer 105 includes multiple color-resist blocks 1051, and at least one color-resist block 1051 contacts a sidewall of the signal lead-out structure 104.

The color-resist layer 105 includes multiple color-resist blocks 1051, and color-resist blocks of different colors can emit light in different colors.

At least one color-resist block 1051 contacts the sidewall of the signal lead-out structure 104, that is, as shown in FIG. 4, it may be that one color-resist block 1051 contacts the sidewall of the signal lead-out structure 104; and as shown in FIGS. 5 to 8, it may also be that multiple color-resist blocks 1051 contact the sidewall of the signal lead-out structure 104. As shown in FIG. 4, in a case where one color-resist block 1051 contacts the sidewall of the signal lead-out structure 104, the signal lead-out structure 104 may be located within the coverage area of the color-resist layer 105. As shown in FIGS. 5 to 8, in a case where multiple color-resist blocks 1051 contact the sidewall of the signal lead-out structure 104, the signal lead-out structure 104 may be located in a region in which multiple color-resist blocks 1051 are close to each other. For example, in FIG. 5, it is illustrated three types of color-resist blocks 1051, each having a quadrilateral shape, which share a same signal lead-out structure 104 having a hexagonal shape. For example, in FIG. 6, it is illustrated two types of color-resist blocks 1051, each having a hexagonal shape, which share a same signal lead-out structure 104 having a hexagonal shape. For example, in FIG. 7, it is illustrated two types of color-resist blocks 1051, each having a quadrilateral shape, which share the same signal lead-out structure 104 having an octagonal shape. For example, in FIG. 8, it is illustrated six types of color-resist blocks 1051, each having a triangular shape, which share the same signal lead-out structure 104 having a dodecagonal shape. Multiple color-resist blocks 1051 contact different sidewalls of the same signal lead-out structure 104, so that the number of insulating bosses 1041 in the signal lead-out structure 104 can be reduced, the coverage area of the color-resist layer 105 in the array substrate can be increased, and with this arrangement, the display aperture ratio of the display panel can be increased.

Figure 9:
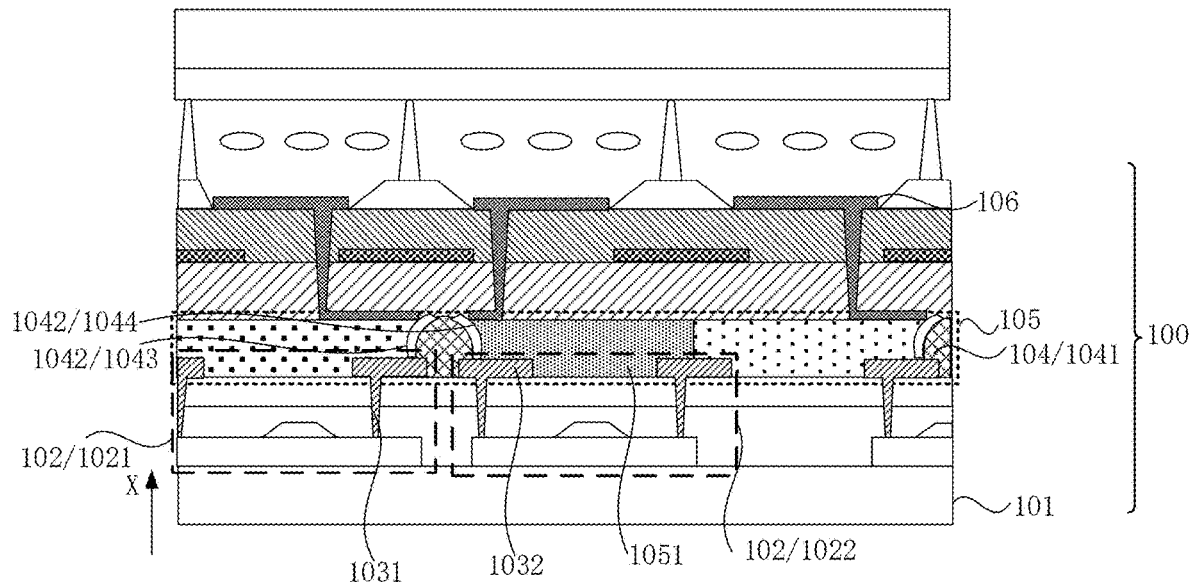
FIG. 9 is another structural diagram of an array substrate according to an embodiment of the present disclosure.

FIG. 9 is another structural diagram of an array substrate according to an embodiment of the present disclosure. As shown in FIG. 9, in some embodiments, at least two color-resist blocks 1051 surround the sidewall of the signal lead-out structure 104.

The driver circuits 102 include multiple driver circuit sets, each driver circuit set includes at least a first driver circuit 1021 and a second driver circuit 1022, and the number of driver circuits in each driver circuit set is the same as the number of color-resist blocks 1051 around the sidewall of the signal lead-out structure 104. The first driver circuit 1021 includes a first output electrode 1031, and the second driver circuit 1022 includes a second output electrode 1032.

The signal lead-out wires 1042 include at least a first signal lead-out wire 1043 and a second signal lead-out wire 1044, and the first signal lead-out wire 1043 is insulated from the second signal lead-out wire 1044.

The first signal lead-out wire 1043 is electrically connected to the first output electrode 1031, and the second signal lead-out wire 1044 is electrically connected to the second output electrode 1032.

As shown in FIG. 9, in a case where at least two color-resist blocks 1051 surround the sidewall of a signal lead-out structure 104, output electrodes 103 of driver circuits, which corresponds to at least two color-resist blocks 1051 surrounding the sidewall of the signal lead-out structure 104, each is electrically connected to a corresponding first electrode 106 through the signal lead-out structure 104. For example, two color-resist blocks 1051 surrounding the sidewalls of the signal lead-out structure 104 are shown in FIG. 9. Correspondingly, a driver circuit set includes two driver circuits 102, namely the first driver circuit 1021 and the second driver circuit 1022 as shown in FIG. 9, and the signal lead-out wires 1042 includes two signal lead-out wires 1042 insulated from each other, namely the first signal lead-out wire 1043 and the second signal lead-out wire 1044 as shown in FIG. 9. The first driver circuit 1021 includes the first output electrode 1031 and the second driver circuit 1022 includes the second output electrode 1032. The first output electrode 1031 is electrically connected to a corresponding first electrode 106 through the first signal lead-out wire 1043, the second output electrode 1032 is electrically connected to a corresponding first electrode 106 through the second signal lead-out wire 1044, and thus the electrical connection between a driver circuit and a corresponding first electrode 106 is achieved and it is ensured that the first electrode 106 receives the display signal normally. In this manner, the signal lead-out structure 104 is disposed in a region in which multiple color-resist blocks 1051 are close to each other, and multiple signal lead-out wires 1042, which are insulated from each other, are arranged to extend along the sidewall of the insulating boss 1041, which can ensure that multiple driver circuits are connected to corresponding first electrodes 106 through one insulating boss 1041, and thus, the number of insulating bosses 1041 can be reduced, the coverage area of the color-resist layer 105 in the array substrate can be increased, and the display aperture ratio of the display panel can be increased in this arrangement.

Based on the above-mentioned embodiments, in a case where at least two color-resist blocks 1051 surround the sidewall of the signal lead-out structure 104, there may be various different arrangements of driver circuit sets or signal lead-out wires 1042. Two feasible arrangements are described as examples in the following, to illustrate how to achieve the electrical connection between a driver circuit set and a corresponding first electrode 106 in a case where at least two color-resist blocks 1051 surround the sidewall of the signal lead-out structure 104.

As a feasible embodiment, with further reference to FIG. 9, in some embodiments, the driver circuit set is arranged to surround a signal lead-out structure 104.

The position of driver circuits 102 in the driver circuit set may be adjusted. For example, the driver circuit set is arranged to surround the signal lead-out structure 104, so that different driver circuits 102 in the driver circuit set share a same insulating boss 1041 of the same signal lead-out structure 104, thereby ensuring that the number of insulating bosses 1041 in the signal lead-out structures 104 can be reduced and the coverage area of the color-resist layer 105 can be increased. As an example, in FIG. 9, the first driver circuit 1021 and the second driver circuit 1022 in the driver circuit set are arranged to surround the signal lead-out structure 104, and the first signal lead-out wire 1043 connected to the first output electrode 1031 with the first electrode 106 and the second signal lead-out wire 1044 connected to the second output electrode 1032 with the first electrode 106 are arranged to extend along the sidewall of the same insulating boss 1041. Thus, on the premise of ensuring the normal transmission of the drive signal, the coverage area of the color-resist layer 105 is increased, and the display aperture ratio of the display panel can be increased in this arrangement.

Based on the above-described embodiments, how a data line and a scan line are connected to a driver circuit in a case where a driver circuit set is arranged to surround a signal lead-out structure 104 is described in the following.

Figure 10:
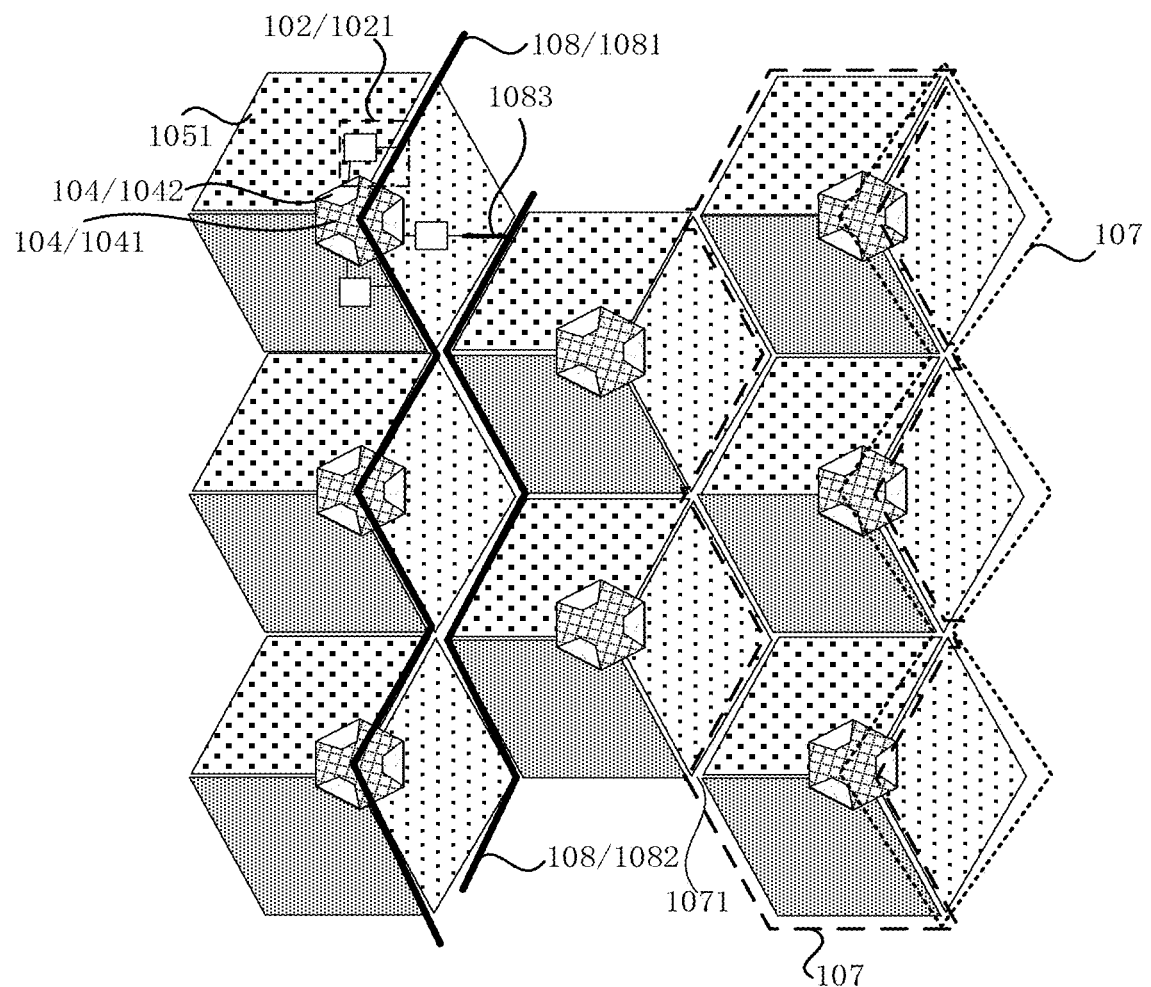
FIG. 10 is another structural diagram of an array substrate according to an embodiment of the present disclosure.
Figure 11:
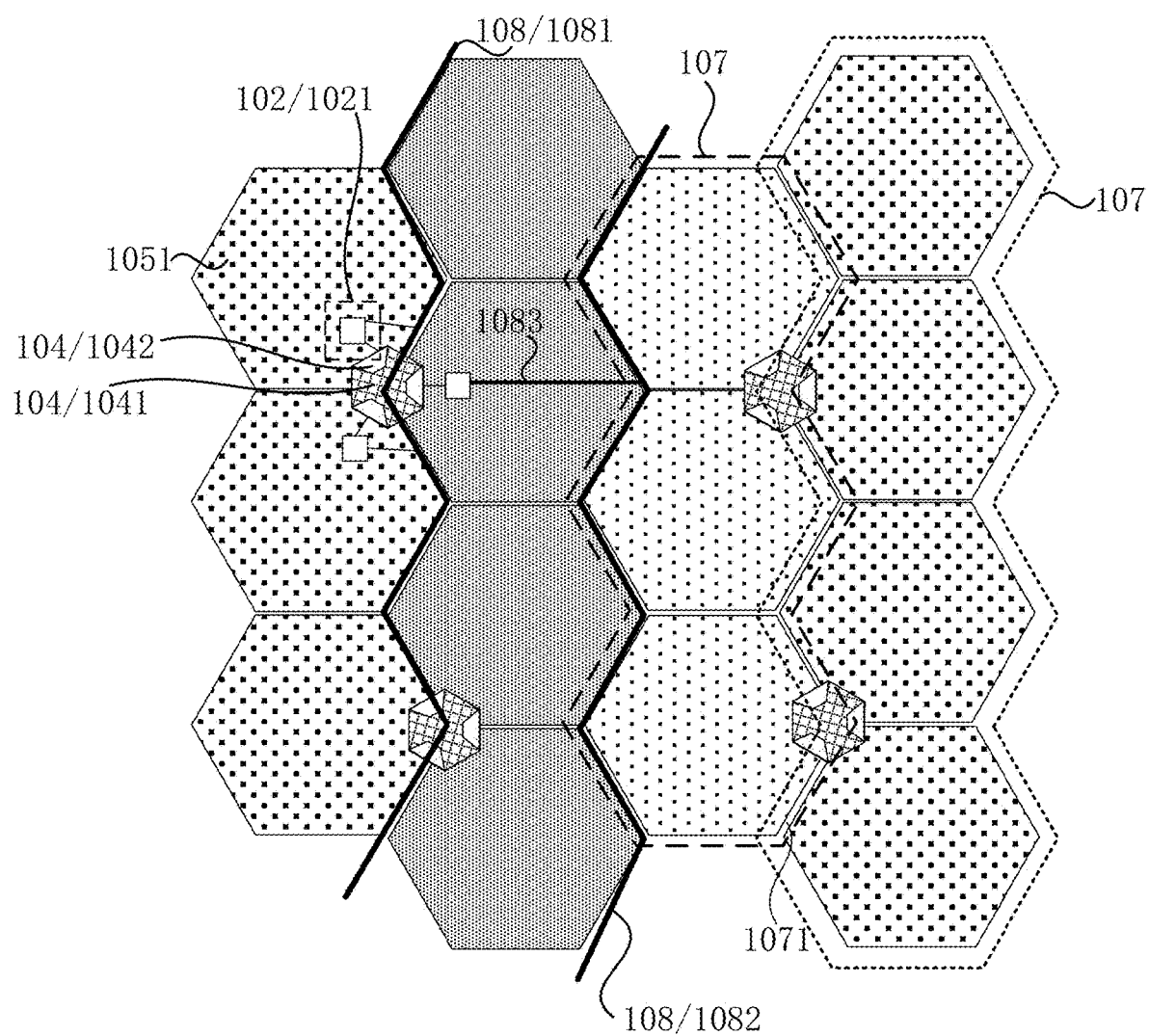
FIG. 11 is another structural diagram of an array substrate according to an embodiment of the present disclosure.
Figure 12:
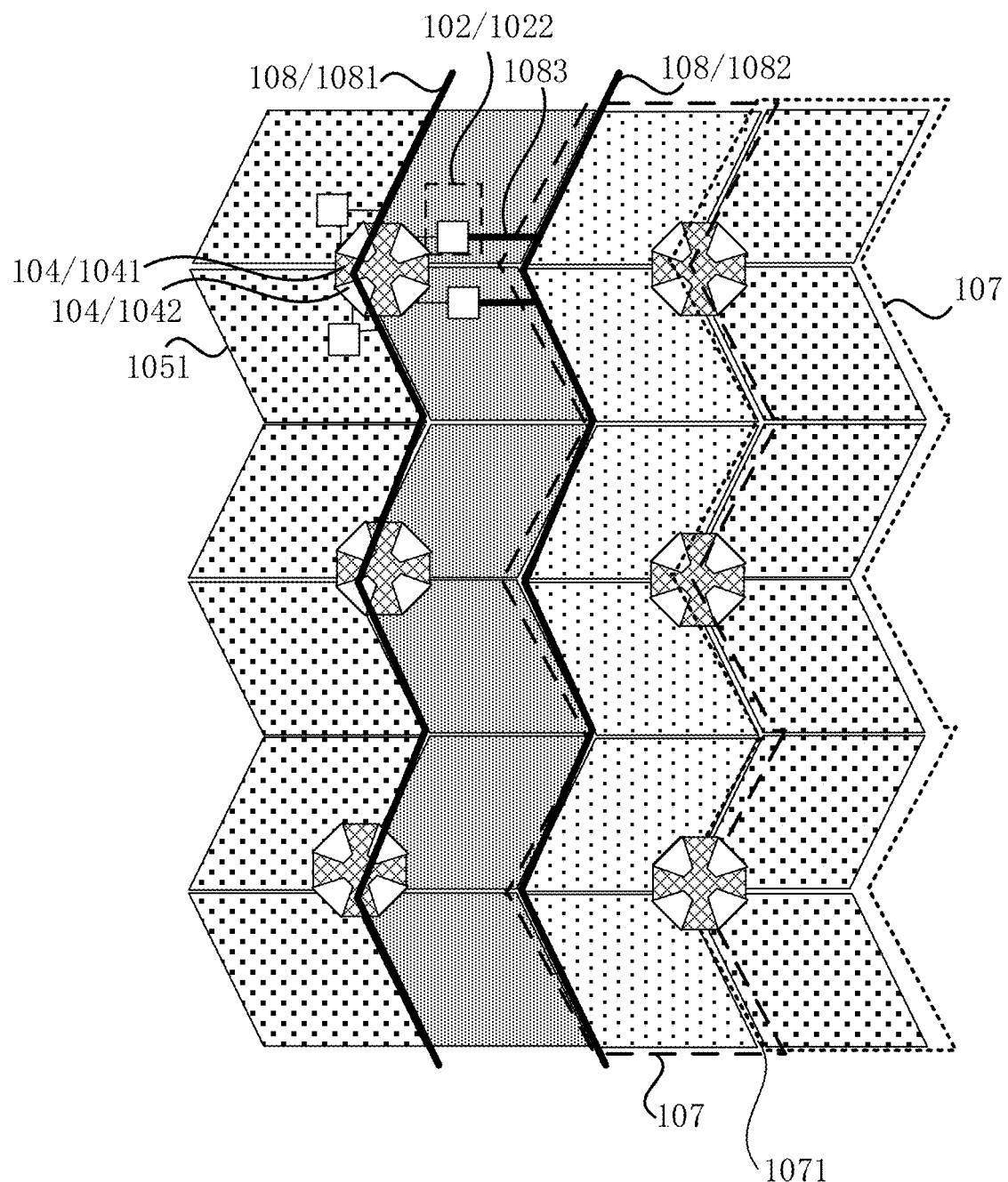
FIG. 12 is another structural diagram of an array substrate according to an embodiment of the present disclosure.
Figure 13:
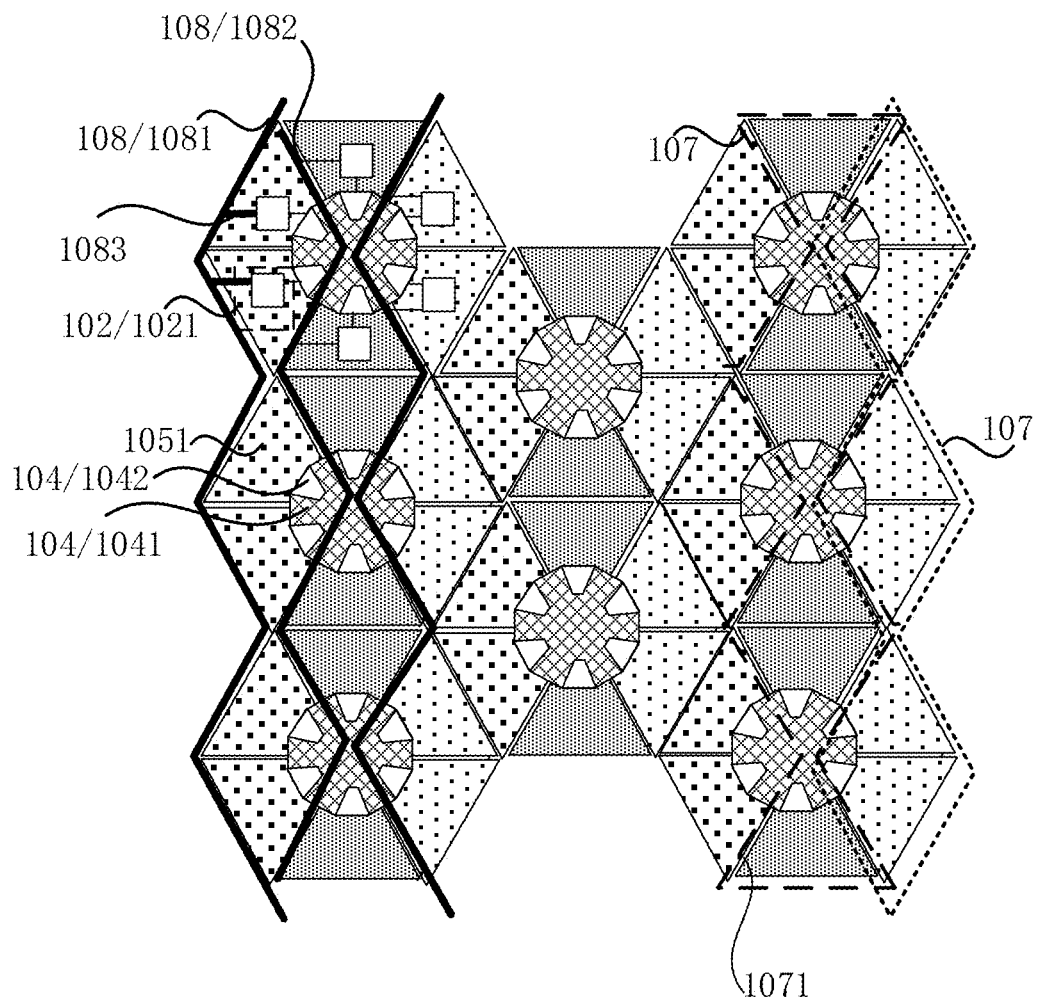
FIG. 13 is another structural diagram of an array substrate according to an embodiment of the present disclosure.

In some embodiments, FIG. 10 is another structural diagram of an array substrate according to an embodiment of the present disclosure, FIG. 11 is another structural diagram of an array substrate according to an embodiment of the present disclosure, FIG. 12 is another structural diagram of an array substrate according to an embodiment of the present disclosure, and FIG. 13 is another structural diagram of an array substrate according to an embodiment of the present disclosure. As shown in FIGS. 10 to 13, FIGS. 10 to 13 only illustrate the connection as an example in a case where one driver circuit set 102 is arranged to surround the signal lead-out structure 104, and the same connection in the same array substrate is not repeated herein. Multiple color-resist blocks 1051 are arranged in a matrix, multiple color-resist blocks 1051 include multiple color-resist columns 107, and a first color-resist gap 1071 exists between two adjacent color-resist columns 107.

The array substrate 100 further includes multiple data signal line sets 108, a data signal line set 108 includes at least a first data signal line 1081 and a second data signal line 1082, the first data signal line 1081 is electrically connected to the first driver circuit 1021, and the second data signal line 1082 is electrically connected to the second driver circuit 1022.

A vertical projection of the first data signal line 1081 on the plane where the substrate 101 is located and a vertical projection of the second data signal line 1082 on the plane where the substrate 101 is located overlap with vertical projections of different first color-resist gaps 1071 on the plane where the substrate 101 is located, respectively. The first data signal line 1081 further includes a first data connection line 1083, and the first driver circuit 1021 is electrically connected to the first data signal line 1081 via the first data connection line 1083, or the second data signal line 1082 further includes a first data connection line 1083, and the second driver circuit 1022 is electrically connected to the second data signal line 1082 via the first data connection line 1083.

Multiple color-resist blocks 1051 are arranged in a matrix, multiple color-resist blocks 1051 include multiple color-resist columns 107, the first color-resist gap 1071 exists between two adjacent color-resist columns 107, and the first color-resist gap 1071 avoids optical crosstalk between adjacent color-resist columns 107. The array substrate 100 further includes multiple data signal line sets 108 for providing driver circuits 102 with data signals. Taking the structure shown in FIGS. 10 to 13 as an example, the data signal line set 108 includes the first data signal line 1081 and the second data signal line 1082. The vertical projection of the first data signal line 1081 on the plane where the substrate 101 is located and the vertical projection of the second data signal line 1082 on the plane where the substrate 101 is located overlap with the vertical projections of different first color-resist gaps 1071 on the plane where the substrate 101 is located, respectively, that is, the first data signal line 1081 and the second data signal line 1082 overlap with different first color-resist gaps 1071 in the direction perpendicular to the plane where the substrate 101 is located, so that crosstalk between data signal lines can be effectively avoided.

To ensure that the first data signal line 1081 and the second data signal line 1082 are electrically connected to driver circuits 102 which correspond to three adjacent color-resist columns 107, the first data signal line 1081 or the second data signal line 1082 further includes the first data connection line 1083. In FIGS. 10 to 12, that the second data signal line 1082 includes the first data connection line 1083 is taken as an example, and in FIG. 13, that the first data signal line 1081 includes the first data connection line 1083 is taken as an example. As shown in FIGS. 10 to 13, the first driver circuit 1021 is electrically connected to the first data signal line 1081 via the first data connection line 1083, thus achieving that the first driver circuit 1021 being relatively far from the first data signal line 1081 can receive a data signal outputted by the first data signal line 1081, achieving that the first driver circuit 1021 outputs the drive signal and achieving the display. Similarly, the second driver circuit 1022 may be electrically connected to the second data signal line 1082 via the first data connection line 1083, thereby ensuring normal display.

To describe the connection between the driver circuits 102 and the data signal lines, only the driver circuits 102 in the region corresponding to part of color-resist blocks 1051, rather than all the driver circuits 102 in the region corresponding to all of color-resist blocks 1051 are shown in FIGS. 10 to 14. The arrangement of remaining driver circuits 102 is similar to that of the driver circuits 102 shown in the FIGS. 10 to 14, and details are not repeated herein. Only part of driver circuits 102 are shown in subsequent drawings too, and the arrangement of the remaining driver circuits 102 is also similar to that of the driver circuits 102 shown in the subsequent drawings.

In summary, in the above-mentioned embodiments, different data signal lines overlap with different first color-resist gaps 1071 respectively, and how to achieve the connection between a data signal line and a driver circuit 102 is implemented by adding the first data connection line 1083. Next, the connection between a data signal line and a driver circuit 102 is described in another embodiment.

Figure 14:
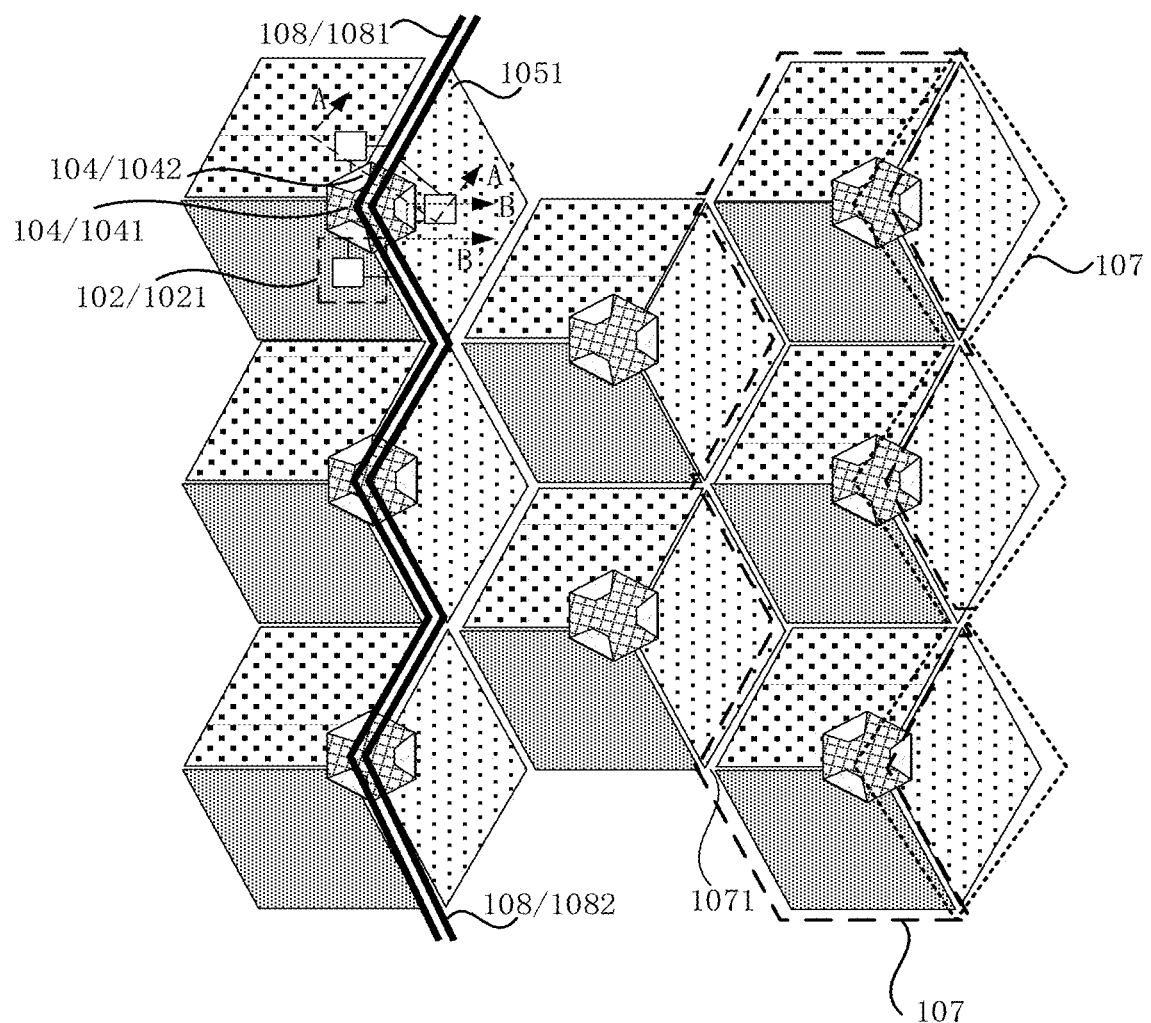
FIG. 14 is another structural diagram of an array substrate according to an embodiment of the present disclosure.
Figure 15:
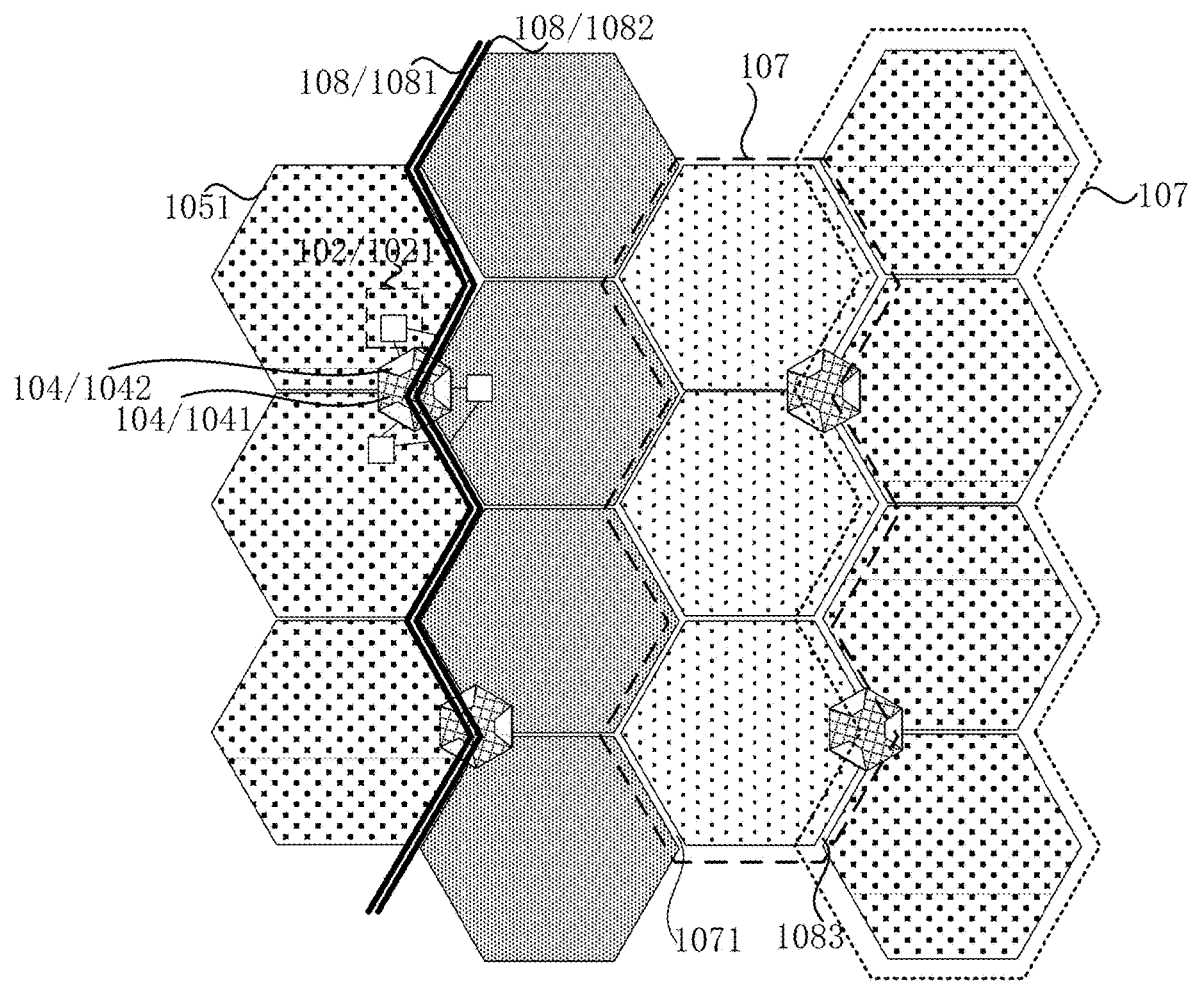
FIG. 15 is another structural diagram of an array substrate according to an embodiment of the present disclosure.
Figure 16:
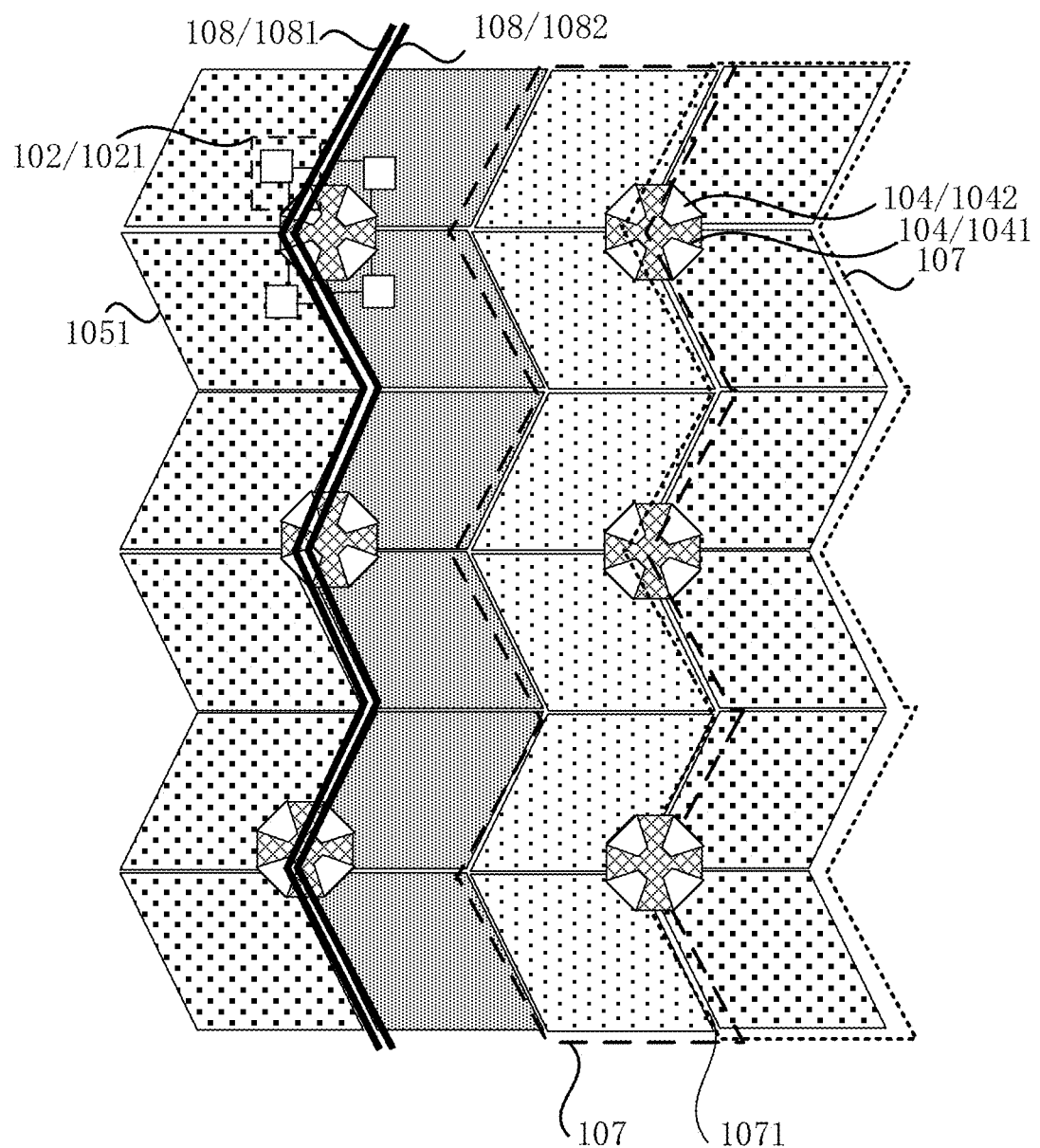
FIG. 16 is another structural diagram of an array substrate according to an embodiment of the present disclosure.
Figure 17:
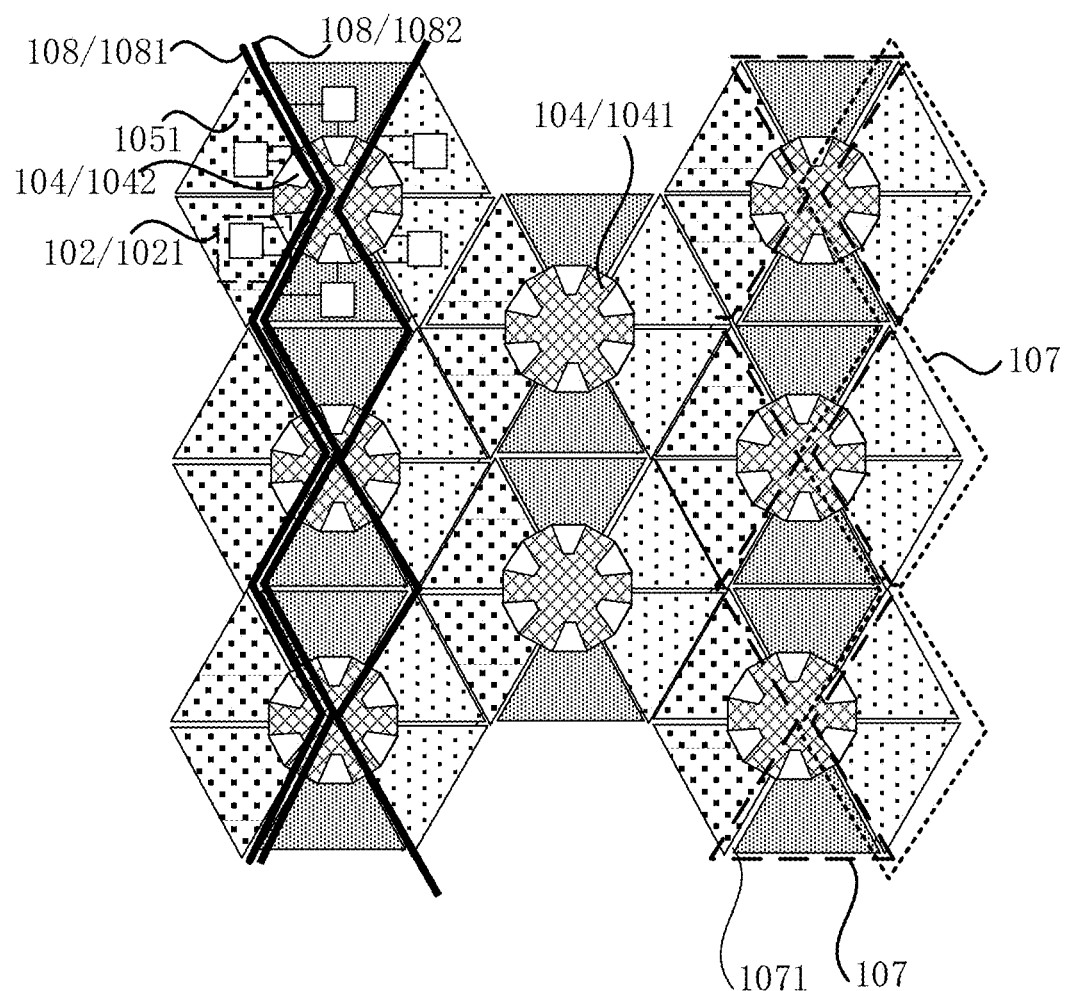
FIG. 17 is another structural diagram of an array substrate according to an embodiment of the present disclosure.

FIG. 14 is another structural diagram of an array substrate according to an embodiment of the present disclosure, FIG. 15 is another structural diagram of an array substrate according to an embodiment of the present disclosure, FIG. 16 is another structural diagram of an array substrate according to an embodiment of the present disclosure, and FIG. 17 is another structural diagram of an array substrate according to an embodiment of the present disclosure. As shown in FIGS. 14 to 17, in some embodiments, multiple color-resist blocks 1051 are arranged in a matrix, multiple color-resist blocks 1051 include multiple color-resist columns 107, and a first color-resist gap 1071 exists between two adjacent color-resist columns 107.

The array substrate 100 further includes multiple data signal line sets 108, a data signal line set 108 includes at least a first data signal line 1081 and a second data signal line 1082, the first data signal line 1081 is electrically connected to the first driver circuit 1021, and the second data signal line 1082 is electrically connected to the second driver circuit 1022.

A vertical projection of the first data signal line 1081 on the plane where the substrate 101 is located and a vertical projection of the second data signal line 1082 on the plane where the substrate 101 is located overlap with a vertical projection of a same first color-resist gap 1071 on the plane where the substrate 101 is located.

Taking the structure shown in FIGS. 14 to 17 as an example, each data signal line set 108 includes the first data signal line 1081 and the second data signal line 1082, the first data signal line 1081 is electrically connected to the first driver circuit 1021, and the second data signal line 1082 is electrically connected to the second driver circuit 1022, thus achieving transmission of a data signal in the driver circuit 102, thereby ensuring the display effect. The vertical projection of the first data signal line 1081 on the plane where the substrate 101 is located and the vertical projection of the second data signal line 1082 on the plane where the substrate 101 is located overlap with the vertical projection of the same first color-resist gap 1071 on the plane where the substrate 101 is located, that is, the first data signal line 1081 and the second data signal line 1082 overlap with the same first color-resist gaps 1071 in the direction perpendicular to the plane where the substrate 101 is located, so that the first data signal line 1081 and the second data signal line 1082 can be directly electrically connected to corresponding driver circuits. In this manner, the drive of driver circuits corresponding to adjacent color-resist columns 107 can be achieved without arranging a first data connection line 1083, thereby ensuring a simple connection between data signal lines and corresponding driver circuits.

Only one kind of connection between driver circuits 102 and data signal line sets 108 is shown in FIGS. 10 to 17 as an example. Other connections may be selected according to actual design requirements and are not limited in the embodiments.

In an example, blocks represent driver circuits in FIGS. 10 to 17 and subsequent drawings, and embodiments of the present disclosure do not limit the shape and structure of the driver circuits. Furthermore, in order to represent the electrical connection between a driver circuit and one of a data signal line, a scan signal line, or the signal lead-out structure, examples also show that the projection of the driver circuit does not overlap with each projection of projections of the data signal line, the scan signal line, and the signal lead-out structure, and the electrical connection is achieved through a connection line. In an actual structure, part of the films in the driver circuits may be disposed in the same layer with the data signal line and the scan signal line. The projection of the driver circuit may overlap with the projection of the data signal line, and the projection of the driver circuit may overlap with the projection of the scan signal line. The connection may be achieved by using a via-hole and there is no connection line, which is not limited in embodiments of the present disclosure.

Figure 18:
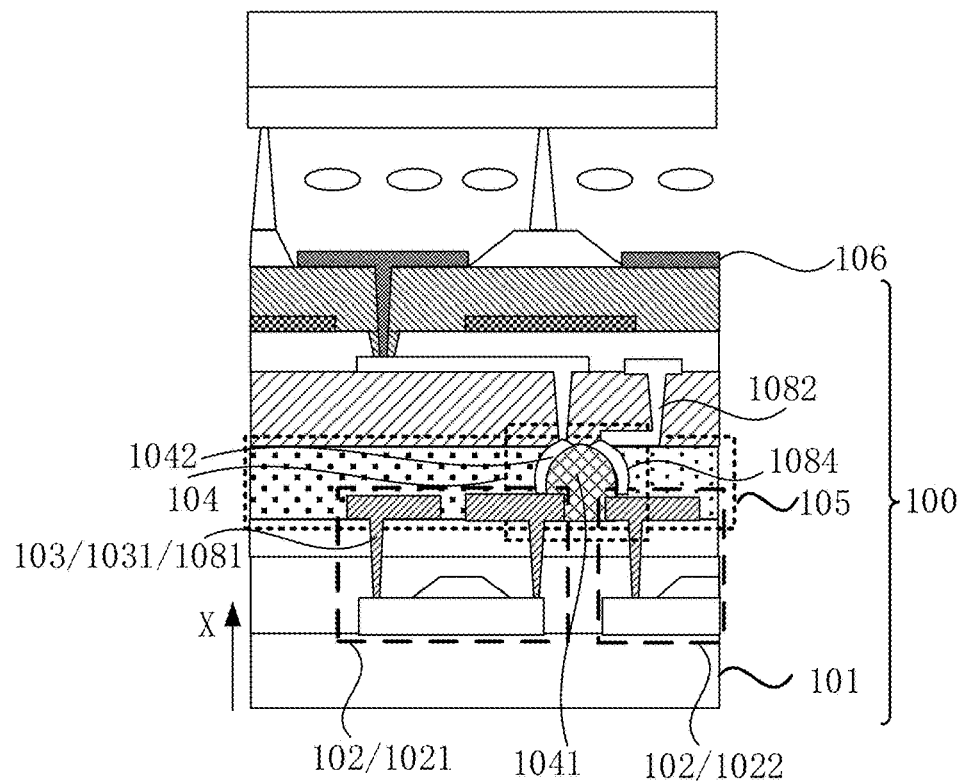
FIG. 18 is a section view of the array substrate shown in FIG. 14 along a section line A-A'.
Figure 19:
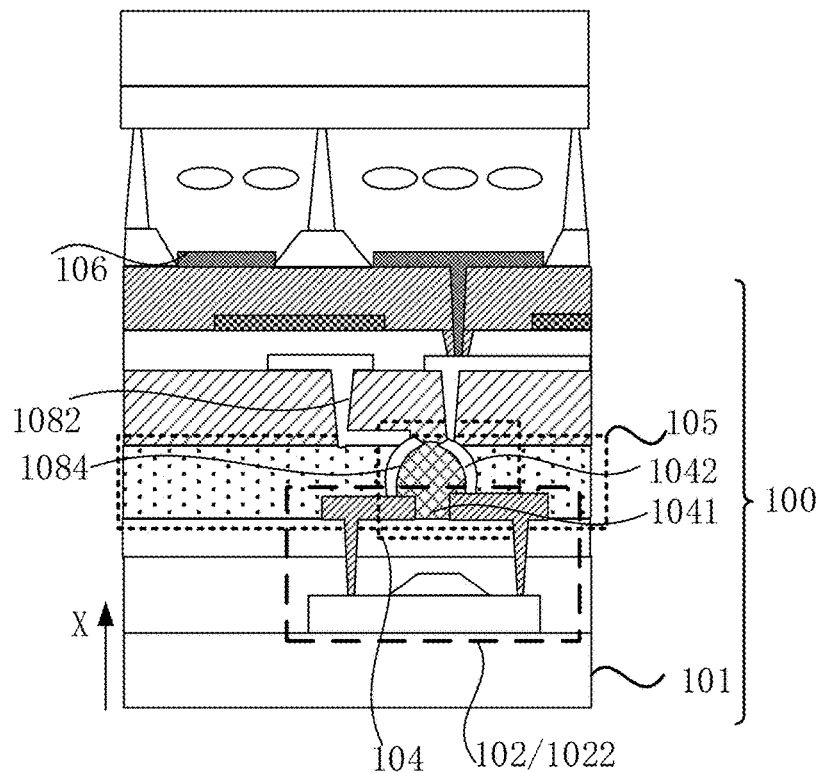
FIG. 19 is a section view of the array substrate shown in FIG. 14 along a section line B-B'.

FIG. 18 is a section view of the array substrate shown in FIG. 14 along a section line A-A', and FIG. 19 is a section view of the array substrate shown in FIG. 14 along a section line B-B'. As shown in FIG. 14, FIG. 18, and FIG. 19, in some embodiments, the first data signal line 1081 and the second data signal line 1082 are disposed in different layers.

The vertical projection of the first data signal line 1081 on the plane where the substrate 101 is located and the vertical projection of the second data signal line 1082 on the plane where the substrate 101 is located overlap with the vertical projection of the same first color-resist gap 1071 on the plane where the substrate 101 is located. In general, the first data signal line 1081 and the second data signal line 1082 transmit different data signals. To avoid crosstalk between the first data signal line 1081 and the second data signal line 1082 which are adjacent, the first data signal line 1081 and the second data signal line 1082 may be disposed in different layers, thereby ensuring the normal transmission of the data signal.

In some embodiments, with further reference to FIGS. 18 and 19, the first data signal line 1081 is located on a side of the color-resist layer 105 facing to the substrate 101, and the second data signal line 1082 is located on a side of the color-resist layer 105 facing away from the substrate 101.

The second data signal line 1082 further includes a second data connection line 1084, the second data signal line 1082 is electrically connected to the second driver circuit 1022 via the second data connection line 1084, and the second data connection line 1084 extends along a sidewall of the insulating boss 1041.

In general, the first data signal line 1081 and the output electrode 103 of the driver circuit 102 are disposed in the same layer, and namely the first data signal line 1081 is located on the side of the color-resist layer 105 facing to the substrate 101. Since the first data signal line 1081 and the second data signal line 1082 are disposed in different layers, the second data signal line 1082 may be located on the side of the color-resist layer 105 facing away from the substrate 101, the second data signal line 1082 is electrically connected to the second driver circuit 1022 via the second data connection line 1084, and the second data connection line 1084 extends along the sidewall of the insulating boss 1041. Namely, the arrangement of the second data connection line 1084 may be the same as the arrangement of the signal lead-out wire 1042. In this manner, the process of drilling via-holes and residues in the via-holes can be avoided when the second data signal line 1082 is electrically connected to a corresponding driver circuit, and the electrical connection between the second data signal line 1082 and the second driver circuit 1022 is achieved.

In summary, the data signal lines are taken as an example to describe the arrangement of the data signal lines in a case where the driver circuit sets are arranged to surround the signal lead-out structure, and the arrangement of the scan signal lines is taken as an example in the following.

Figure 20:
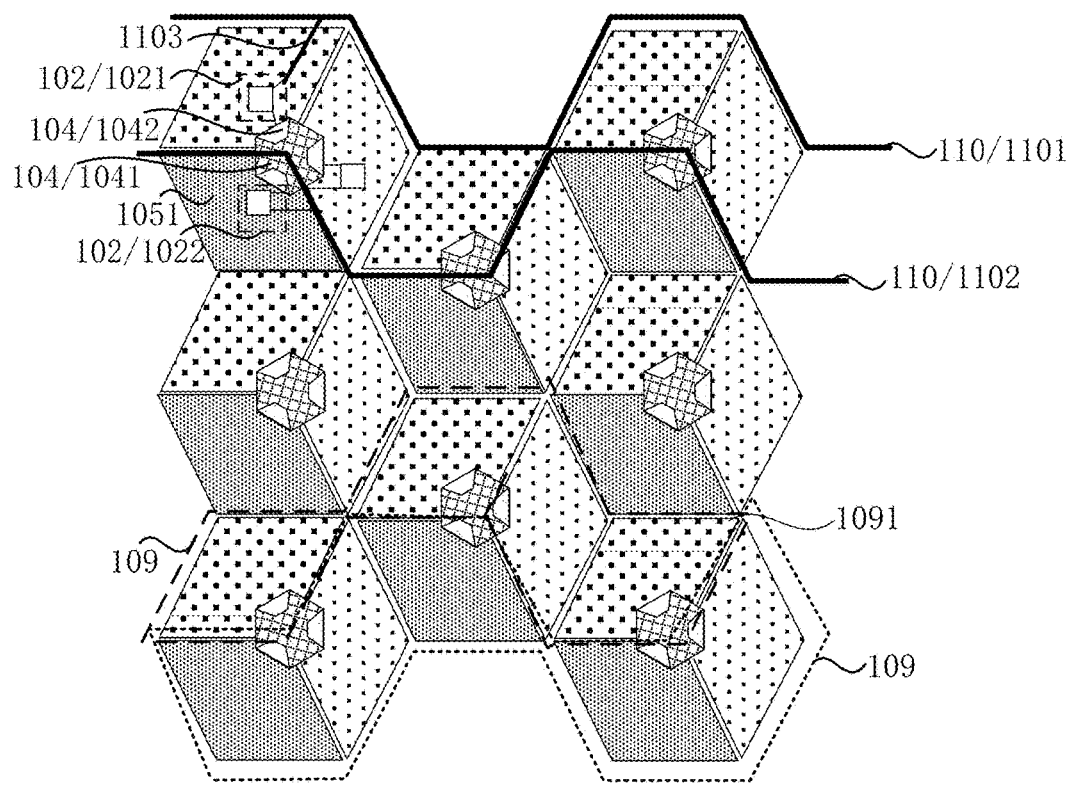
FIG. 20 is another structural diagram of an array substrate according to an embodiment of the present disclosure.
Figure 21:
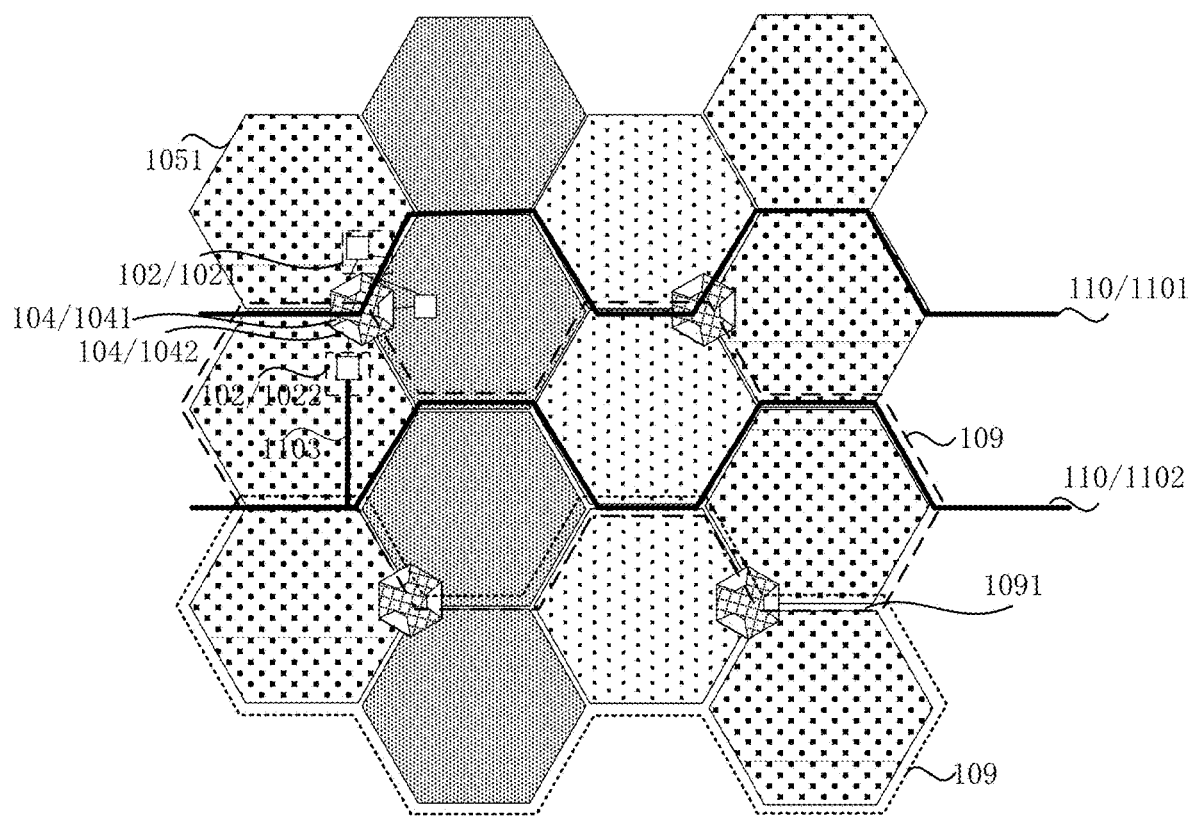
FIG. 21 is another structural diagram of an array substrate according to an embodiment of the present disclosure.
Figure 22:
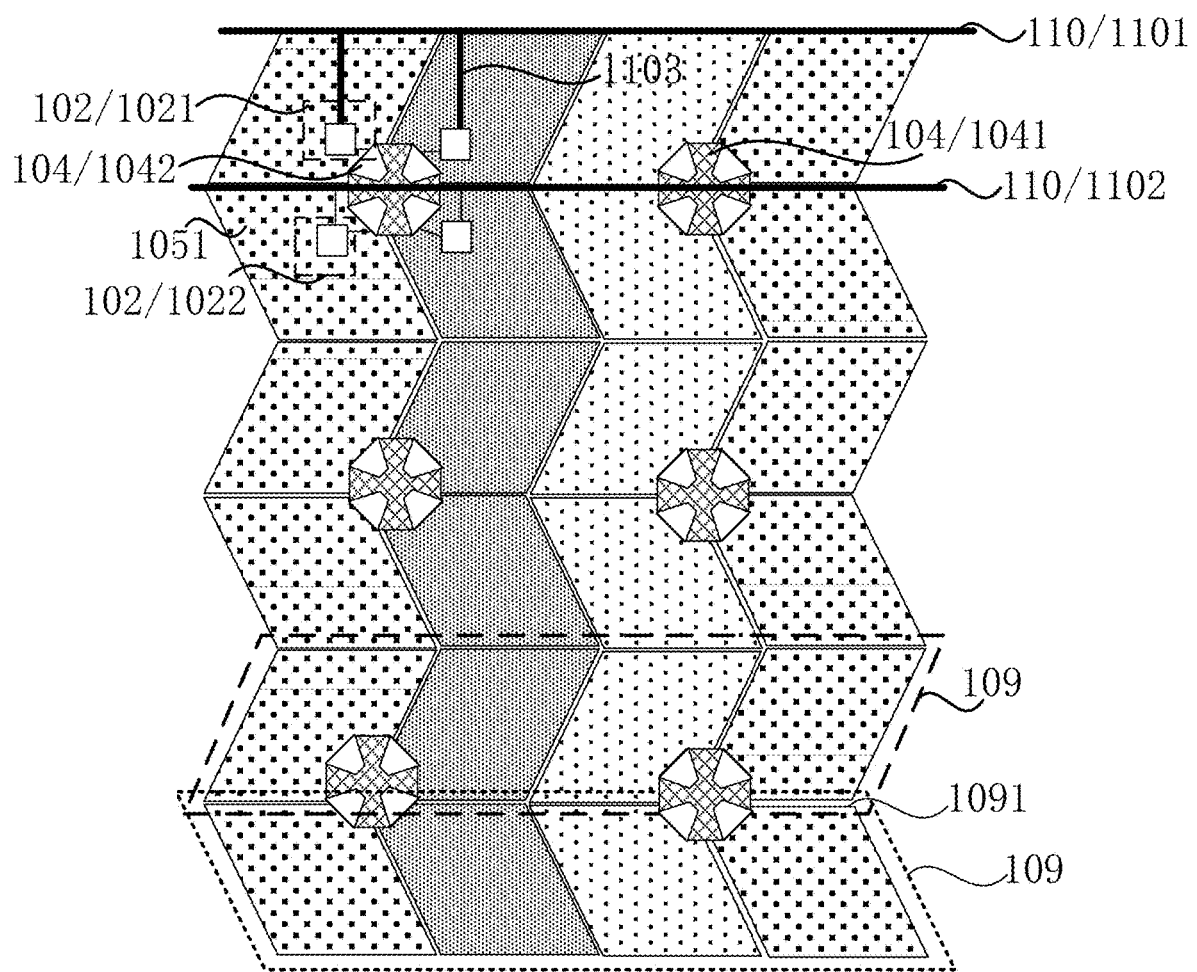
FIG. 22 is another structural diagram of an array substrate according to an embodiment of the present disclosure.
Figure 23:
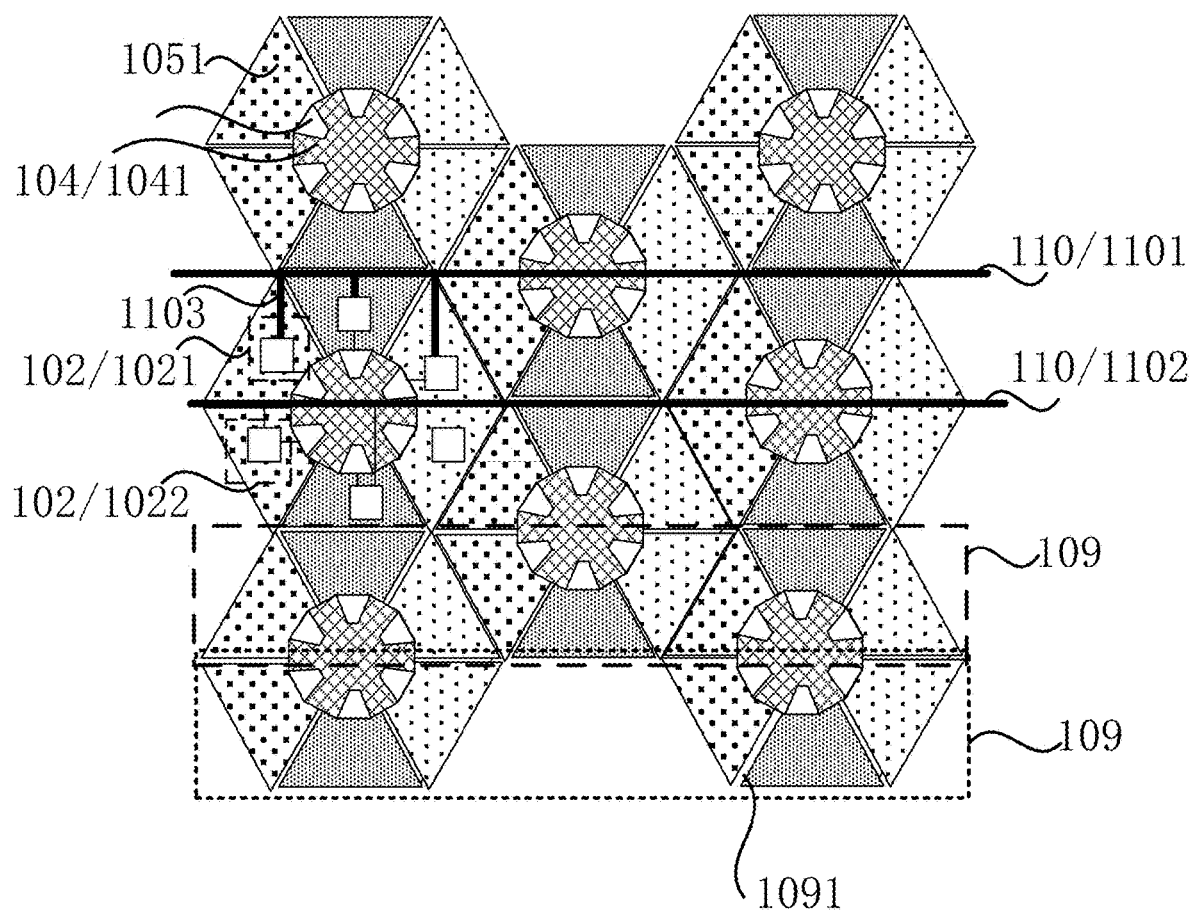
FIG. 23 is another structural diagram of an array substrate according to an embodiment of the present disclosure.

FIG. 20 is another structural diagram of an array substrate according to an embodiment of the present disclosure, FIG. 21 is another structural diagram of an array substrate according to an embodiment of the present disclosure, FIG. 22 is another structural diagram of an array substrate according to an embodiment of the present disclosure, and FIG. 23 is another structural diagram of an array substrate according to an embodiment of the present disclosure. As shown in FIGS. 20 to 23, in some embodiments, multiple color-resist blocks 1051 are arranged in a matrix, multiple color-resist blocks 1051 include multiple color-resist rows 109, and a second color-resist gap 1091 exists between two adjacent color-resist rows 109.

The array substrate 100 further includes multiple scan signal line sets 110, a scan signal line set 110 includes at least a first scan signal line 1101 and a second scan signal line 1102, the first scan signal line 1101 is electrically connected to the first driver circuit 1021, and the second scan signal line 1102 is electrically connected to the second driver circuit 1022.

A vertical projection of the first scan signal line 1101 on the plane where the substrate 101 is located and a vertical projection of the second scan signal line 1102 on the plane where the substrate 101 is located overlap with vertical projections of different second color-resist gaps 1091 on the plane where the substrate 101 is located, respectively; and the first scan signal line 1101 further includes a first scan connection line 1103, and is electrically connected to the first scan signal line 1101 via the first scan connection line 1103, or the second scan signal line 1102 further includes a first scan connection line 1103, and is electrically connected to the second scan signal line 1102 via the first scan connection line 1103.

Multiple color-resist blocks 1051 are arranged in a matrix, multiple color-resist blocks 1051 include multiple color-resist rows 109, the second color-resist gap 1091 exists between two adjacent color-resist rows 109, and optical crosstalk between adjacent color-resist rows 109 is avoided by the second color-resist gap 1091. Taking the structure shown in FIGS. 20 to 23 as an example, a scan signal line set 110 including the first scan signal line 1101 and the second scan signal line 1102 is described as an example, the first scan signal line 1101 is electrically connected to the first driver circuit 1021, and the second scan signal line 1102 is electrically connected to the second driver circuit 1022, thus achieving transmission of a scan signal in the driver circuit 102, thereby ensuring the display effect. The vertical projection of the first scan signal line 1101 on the plane where the substrate 101 is located and the vertical projection of the second scan signal line 1102 on the plane where the substrate 101 is located overlap with the vertical projections of different second color-resist gaps 1091 on the plane where the substrate 101 is located, respectively, that is, the first scan signal line 1101 and the second scan signal line 1102 overlap with different second color-resist gaps 1091 in the direction perpendicular to the plane where the substrate 101 is located, thus avoiding the crosstalk between the first scan signal line 1101 and the second scan signal line 1102.

To ensure that each scan signal line performs signal scanning on a transmission of each color-resist row 109, the first scan signal line 1101 or the second scan signal line 1102 further includes the first scan connection line 1103. In FIGS. 20, 22 to 23, the first scan signal line 1101 including the first scan connection line 1103 is described as an example, and in FIG. 21 the second scan signal line 1102 including the first scan connection line 1103 is described as an example. As shown in FIGS. 20 to 23, the first driver circuit 1021 is electrically connected to the first scan signal line 1101 via the first scan connection line 1103, thus achieving that a scan signal of the first scan signal line 1101 can be transmitted to the first driver circuit 1021 and the first driver circuit 1021 can output a corresponding drive signal, thereby ensuring the display. Similarly, the second driver circuit 1022 may be electrically connected to the second scan signal line 1102 via the first scan connection line 1103, thereby ensuring the display effect.

In summary, in the above-mentioned embodiments, different scan signal lines overlap with different second color-resist gaps, and how to achieve the connection between a scan signal line and a driver circuit is explained by adding the first scan connection line. Another embodiment for the connection between a scan signal line and a driver circuit is described in the following.

Figure 24:
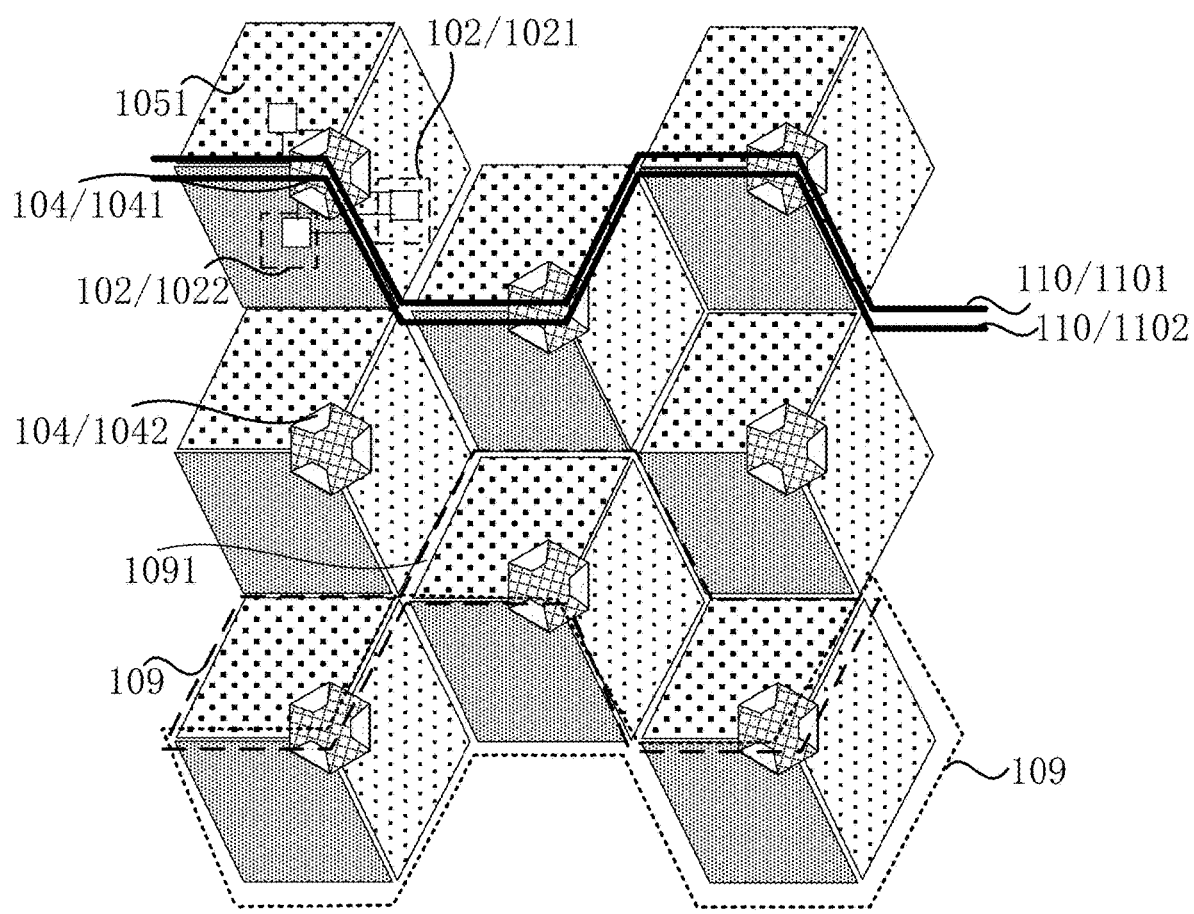
FIG. 24 is another structural diagram of an array substrate according to an embodiment of the present disclosure.
Figure 25:
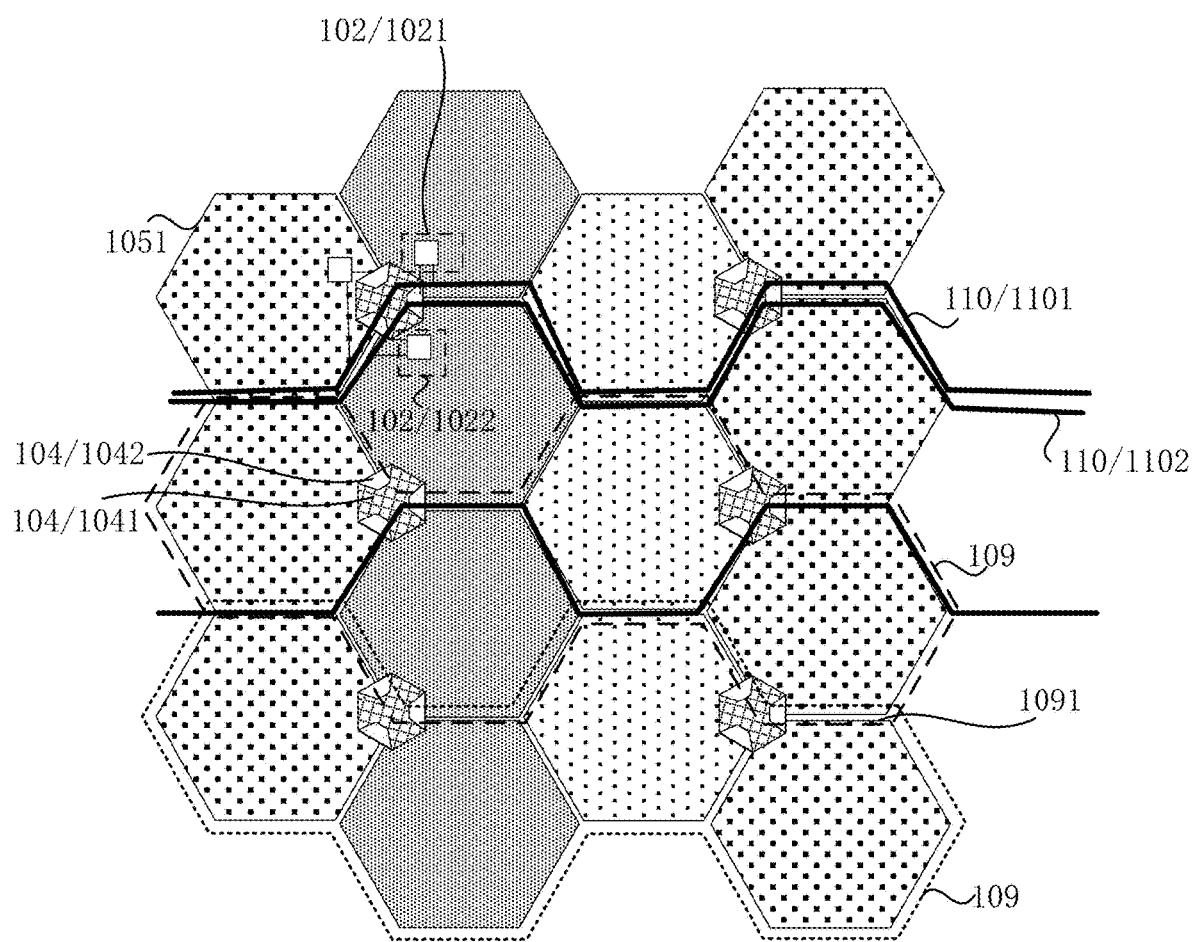
FIG. 25 is another structural diagram of an array substrate according to an embodiment of the present disclosure.
Figure 26:
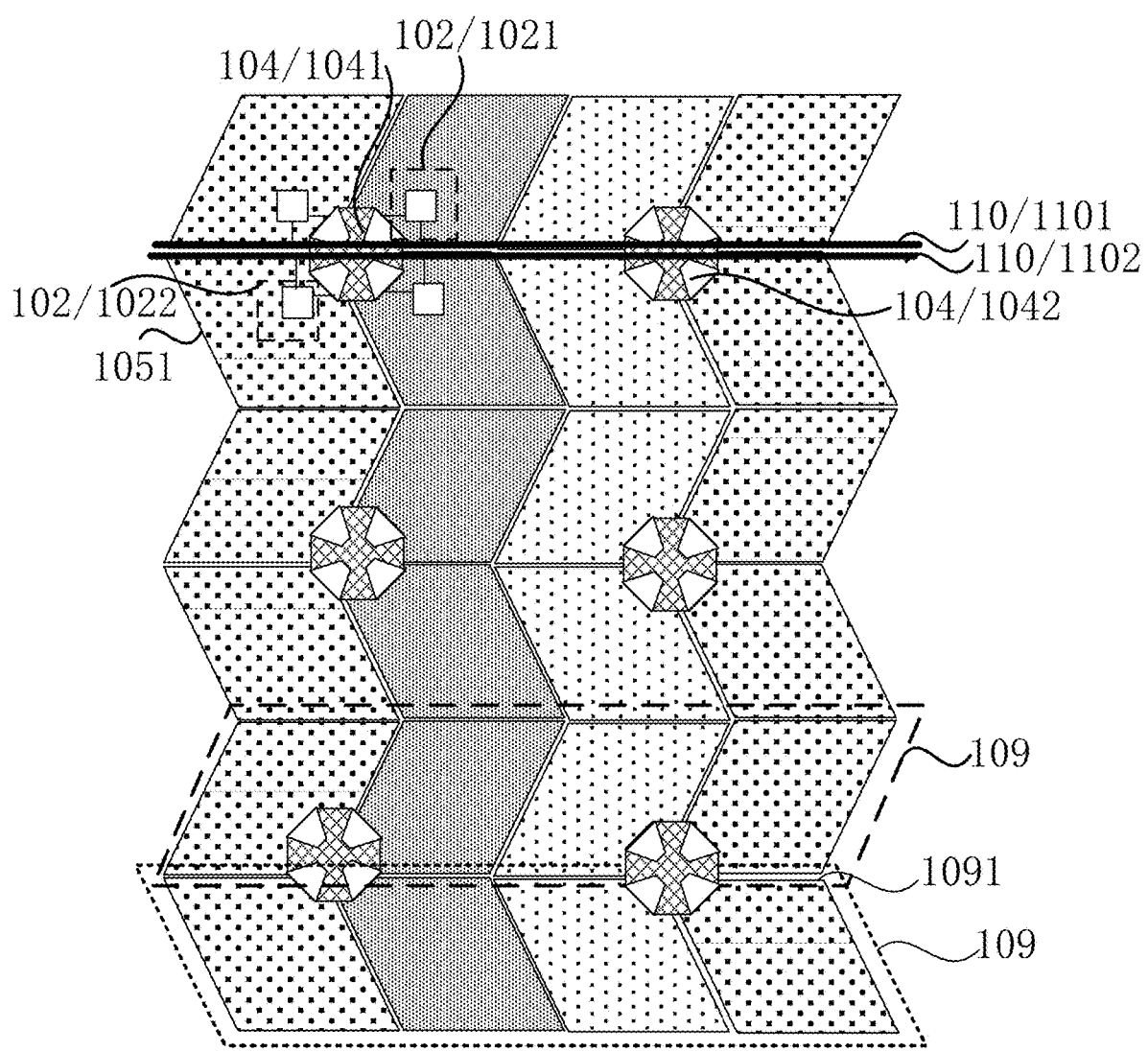
FIG. 26 is another structural diagram of an array substrate according to an embodiment of the present disclosure.
Figure 27:
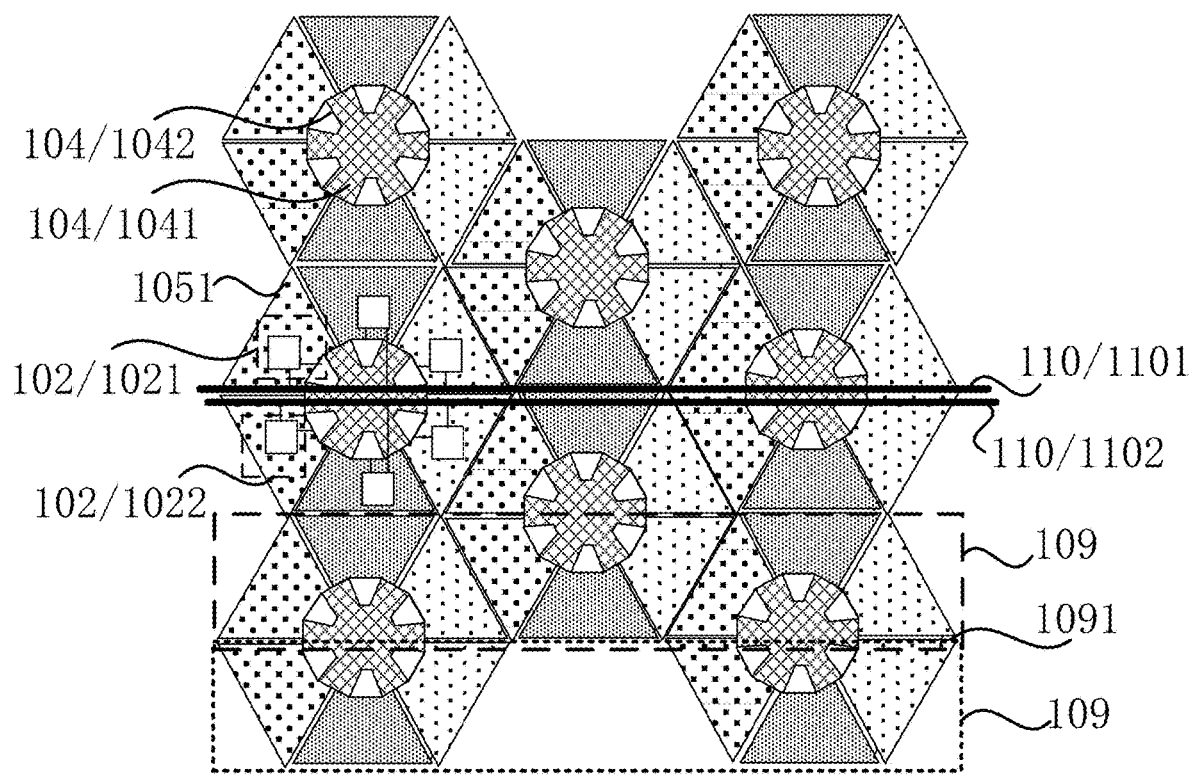
FIG. 27 is another structural diagram of an array substrate according to an embodiment of the present disclosure.

FIG. 24 is another structural diagram of an array substrate according to an embodiment of the present disclosure, FIG. 25 is another structural diagram of an array substrate according to an embodiment of the present disclosure, FIG. 26 is another structural diagram of an array substrate according to an embodiment of the present disclosure, and FIG. 27 is another structural diagram of an array substrate according to an embodiment of the present disclosure. As shown in FIGS. 24 to 27, in some embodiments, multiple color-resist blocks 1051 are arranged in a matrix, multiple color-resist blocks 1051 include multiple color-resist rows 109, and a second color-resist gap 1091 exists between two adjacent color-resist rows 109.

The array substrate 100 further includes multiple scan signal line sets 110, each scan signal line set 110 includes at least a first scan signal line 1101 and a second scan signal line 1102, the first scan signal line 1101 is electrically connected to the first driver circuit 1021, and the second scan signal line 1102 is electrically connected to the second driver circuit 1022.

The vertical projection of the first scan signal line 1101 on the plane where the substrate 101 is located and the vertical projection of the second scan signal line 1102 on the plane where the substrate 101 is located overlap with a vertical projection of the same second color-resist gap 1091 on the plane where the substrate 101 is located.

Taking the structure shown in FIGS. 24 to 27 as an example, a scan signal line set 110 includes a first scan signal line 1101 and a second scan signal line 1102, the first scan signal line 1101 is electrically connected to the first driver circuit 1021, and the second scan signal line 1102 is electrically connected to the second driver circuit 1022, thus ensuring the normal transmission of the scan signal and the display effect. The vertical projection of the first scan signal line 1101 on the plane where the substrate 101 is located and the vertical projection of the second scan signal line 1102 on the plane where the substrate 101 is located overlap with the vertical projection of the same second color-resist gap 1091 on the plane where the substrate 101 is located, that is, the first scan signal line 1101 and the second scan signal line 1102 overlap with the same second color-resist gap 1091 in the direction perpendicular to the plane where the substrate 101 is located. In this manner, the first scan signal line 1101 and the second scan signal line 1102 are directly connected to corresponding driver circuits, achieving a simple direct connection, reducing the difficulty of the preparation process and the preparation cost. FIGS. 20 to 27 only show one kind of connection between driver circuits and a scan signal line set as an example. The connection may be selected according to the actual design requirements and is not limited in the embodiments.

In summary, the above-mentioned embodiments describe that a driver circuit set surrounds the signal lead-out structure. The adjustment of the position of driver circuits in the driver circuit set ensures that signal lead-out wires corresponding to multiple driver circuits are connected to corresponding first electrodes through the same insulating boss. On the premise of the normal transmission of drive signals is ensured, the coverage area of the color-resist layer is increased, and the display aperture ratio of the display panel can be increased in this arrangement.

Next, the arrangement of a driver circuit set or signal lead-out wires are described in another embodiment in a case where at least two color-resist blocks surround the sidewall of the signal lead-out structure.

Figure 28:
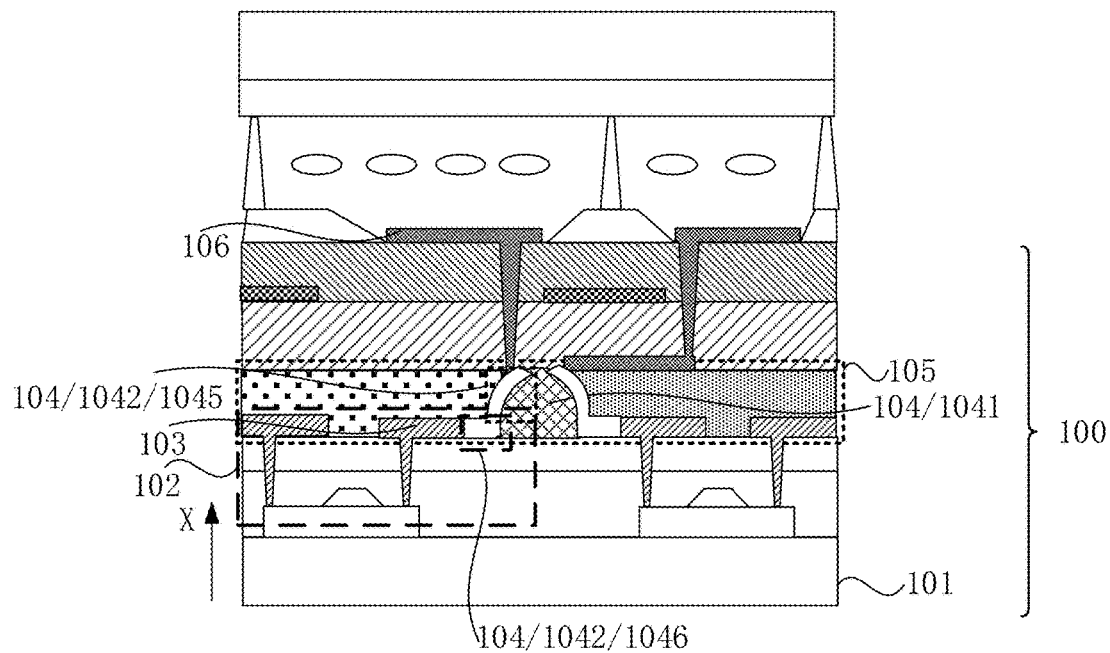
FIG. 28 is another structural diagram of an array substrate according to an embodiment of the present disclosure.

As another feasible embodiment, FIG. 28 is another structural diagram of an array substrate according to an embodiment of the present disclosure. As shown in FIG. 28, in some embodiments, the driver circuits 102 are arranged in an array.

The signal lead-out wire 1042 includes a first lead portion 1045 and a second lead portion 1046 which are connected to each other.

The first lead portion 1045 extends along a sidewall of the insulating boss 1041, and the second lead portion 1046 is disposed in the same layer with the output electrode 103 and is electrically connected to the output electrode 103.

In a case where multiple driver circuits 102 share the same signal lead-out structure 104, the signal lead-out wires 1042 are electrically connected to the output electrodes 103 of the driver circuits 102. Since the driver circuits 102 may be arranged in a distribution manner according to the signal lead-out structure 104, for a driver circuit 102 that is relatively far away from the signal lead-out structure 104, the signal lead-out wire 1042 may include the first lead portion 1045 and the second lead portion 1046 which are connected to each other. the first lead portion 1045 extends along the sidewall of the insulating boss 1041, and the second lead portion 1046 and the output electrode 103 are disposed in the same layer and are electrically connected to each other, thus achieving the electrical connection between the output electrode 103 and the first electrode 106. The second lead portion 1046 and the output electrode 103 are disposed in the same layer, thus ensuring the transmission of the drive signal and reducing the difficulty of the preparation process.

Figure 29:
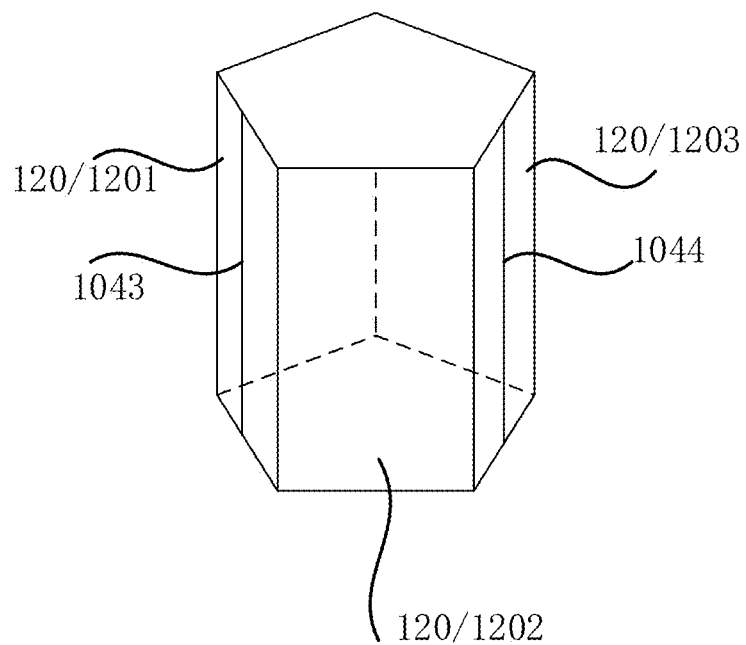
FIG. 29 is a structural diagram of an insulating boss according to an embodiment of the present disclosure.

Based on the above-mentioned embodiments, FIG. 29 is a structural diagram of an insulating boss according to an embodiment of the present disclosure. As shown in FIG. 29, in some embodiments, the sidewall of the insulating boss 1041 includes multiple sub-sidewalls 120: multiple sub-sidewalls 120 include at least a first sub-sidewall 1201, a second sub-sidewall 1202, and a third sub-sidewall 1203, and the second sub-sidewall 1202 is connected to the first sub-sidewall 1201 and the third sub-sidewall 1203 separately.

At least part of the first signal lead-out wire 1043 extends along the first sub-sidewall 1201, and at least part of the second signal lead-out wire 1044 extends along the third sub-sidewall 1203.

The sidewall of the insulating boss 1041 may include multiple sub-sidewalls 120, different signal lead-out wires 1042 extend along different sub-sidewalls, respectively, and at least one sub-sidewall 120 is disposed between different signal lead-out wires 1042, thus avoiding crosstalk between signal lead-out wires 1042, as shown in FIG. 29. For example, in FIG. 29, the sidewall of the insulating boss 1041 includes five sub-sidewalls 120, the first signal lead-out wire 1043 extends along the first sub-sidewall 1201, the second signal lead-out wire 1044 extends along the third sub-sidewall 1203, and the second sub-sidewall 1202 is connected to the first sub-sidewall 1201 and the third sub-sidewall 1203 separately, thus ensuring the normal transmission of the signals of both the first signal lead-out wire 1043 and the second signal lead-out wire 1044.

Figure 30:
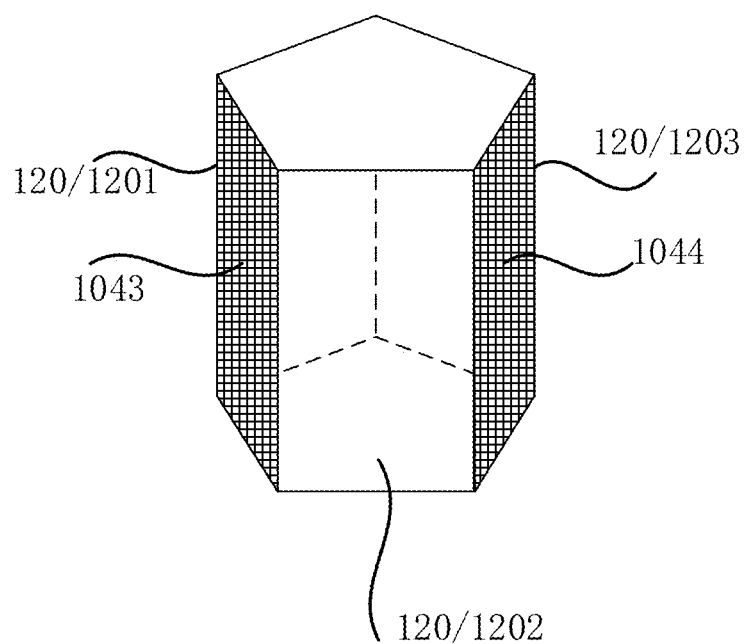
FIG. 30 is another structure diagram of an insulating boss according to an embodiment of the present disclosure.

Based on the above-mentioned embodiments, FIG. 30 is another structural diagram of an insulating boss according to an embodiment of the present disclosure. As shown in FIG. 30, in some embodiments, the sidewall of the insulating boss 1041 includes multiple sub-sidewalls 120, and the signal lead-out wire 1042 covers at least one sub-sidewall 120.

For example, as shown in FIG. 30, the sidewall of the insulating boss 1041 includes five sub-sidewalls 120, and a signal lead-out wire 1042 covers a sub-sidewall 120. The signal lead-out wire 1042 covers the whole sub-sidewall 120. Compared with the signal lead-out wire 1042 extending along a sub-sidewall 120 as a single line, the signal lead-out wire 1042 covering the whole sub-sidewall 120 can help to improve the production yield effectively, and the risk of wire breakage of the signal lead-out wire 1042 can be avoided. Meanwhile, the resistance of the signal lead-out wire 1042 is reduced, the loss of the signal on the signal lead-out wire 1042 during the transmission of the signal is reduced, and the transmission of the signal is improved.

Figure 31:
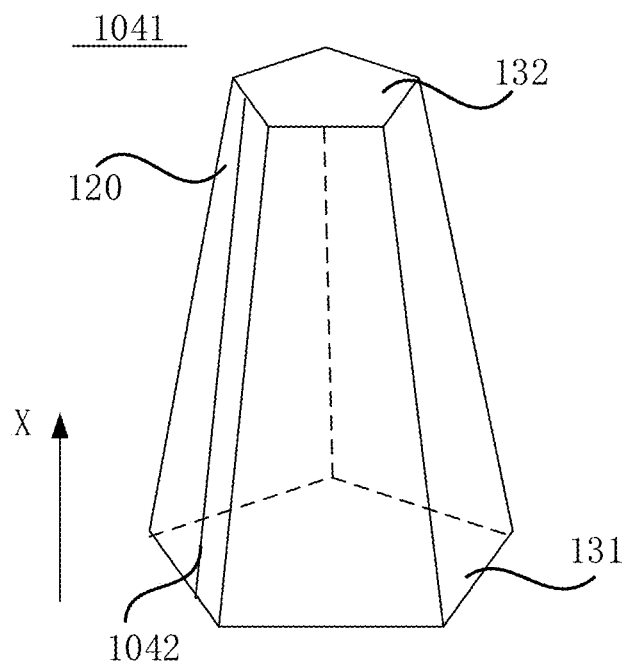
FIG. 31 is another structure diagram of an insulating boss according to an embodiment of the present disclosure.

Based on the above-mentioned embodiments, FIG. 31 is another structural diagram of an insulating boss according to an embodiment of the present disclosure. As shown in FIG. 31, in some embodiments, the insulating boss 1041 includes a first boss section end-surface 131 and a second boss section end-surface 132 which are disposed sequentially in the first direction (the direction X shown in the figure), and the first boss section end-surface 131 is located on a side of the second boss section end-surface 132 facing to the substrate 101. A vertical projection of the first boss section end-surface 131 on the plane where the substrate 101 is located covers a vertical projection of the second boss section end-surface 132 on the plane where the substrate 101 is located.

For example, as shown in FIG. 31, taking the insulating boss 1041, whose bottom is set as a pentagon and that includes five sub-sidewalls 120, as an example, the insulating boss 1041 includes the first boss section end-surface 131 and the second boss section end-surface 132 which are disposed sequentially in the first direction, and the first boss section end-surface 131 is located on the side of the second boss section end-surface 132 facing to the substrate 101. The vertical projection of the first boss section end-surface 131 on the plane where the substrate 101 is located covers the vertical projection of the second boss section end-surface 132 on the plane where the substrate 101 is located. In this manner, the sub-sidewalls 120 of the insulating boss 1041 are ramp-shaped, so that the signal lead-out wires 1042 can be easy to lead out, thereby avoiding the risk of wire breakage of the signal lead-out wires 1042.

Figure 32:
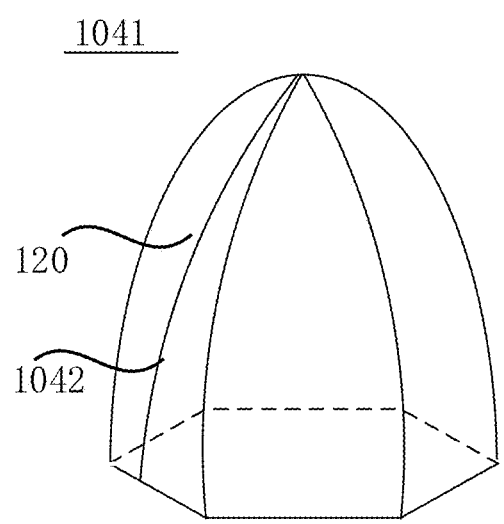
FIG. 32 is another structure diagram of an insulating boss according to an embodiment of the present disclosure.

In some embodiments, FIG. 32 is another structural diagram of an insulating boss according to an embodiment of the present disclosure. As shown in FIGS. 31 and 32, the insulating boss 1041 includes a coned boss structure as shown in FIG. 31: or the sidewall of the insulating boss 1041 includes multiple sub-sidewalls, and at least one of the sub-sidewalls includes a curved surface as shown in FIG. 32.

As shown in FIG. 31, the insulating boss 1041 includes a coned boss structure. The coned boss structure may include a circular coned boss structure with a circular bottom, a triangular coned boss structure with a triangular bottom, a square coned boss structure with a quadrilateral bottom, a pentagonal coned boss structure with a pentagonal bottom, and a hexagonal coned boss structure with a hexagonal bottom, and etc. The shape of the coned boss structure is not limited in the embodiments of the present disclosure. The pentagonal coned boss structure is only taken as an example in FIG. 31. The sub-sidewall 120 of the insulating boss may include a curved surface. For example, as shown in FIG. 32, the bottom of the insulating boss 1041 is hexagonal, the sidewall of the insulating boss 1041 includes six sub-sidewalls 120, and each of the six sub-sidewalls 120 is a curved surface. When the signal lead-out wire 1042 extends along the sub-sidewall 120 that is a curved surface, the risk of wire breakage of the signal lead-out wires 1042 can be effectively reduced.

Figure 33:
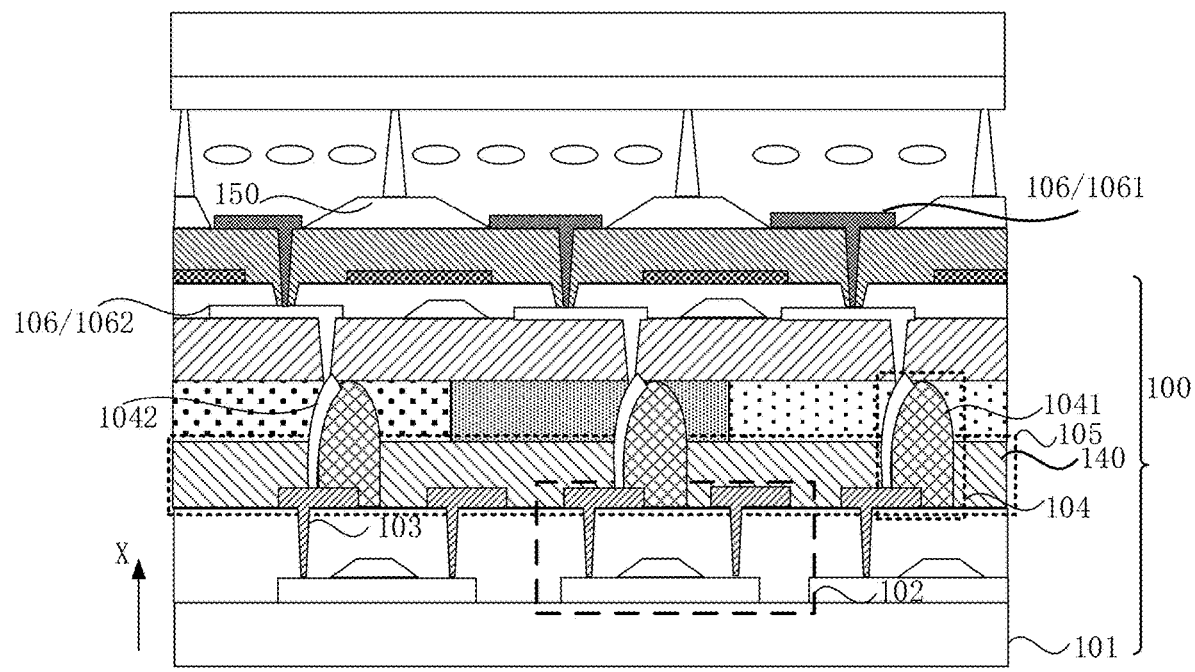
FIG. 33 is another structural diagram of an array substrate according to an embodiment of the present disclosure.

FIG. 33 is another structural diagram of an array substrate according to an embodiment of the present disclosure. As shown in FIG. 33, in some embodiments, the array substrate 100 further includes a planarization layer 140 which is disposed between a film where the driver circuits 102 are located and a film where the color-resist layer 105 is located, and the insulating boss 1041 and the planarization layer 140 are disposed in the same layer.

The planarization layer 140 is located between the film where the driver circuits 102 are located and the film where the color-resist layer 105 is located, and the planarization layer 140 provides a planarized surface for the preparation of the color-resist layer 105, thereby ensuring the preparation of the color-resist layer 105 with a planarized surface and ensuring the effect of the preparation of the display panel. The insulating boss 1041 and the planarization layer 140 are disposed in the same layer and prepared in the same process, so that the thickness of the array substrate can be effectively reduced, the preparation process of the array substrate can be simplified, and the efficiency of preparing the array substrate can be improved. The insulating boss 1041 and the planarization layer 140 are made of the same material, and different filling effects are used to show the structural differences between the insulating boss 1041 and the planarization layer 140 in the drawings.

Figure 34:
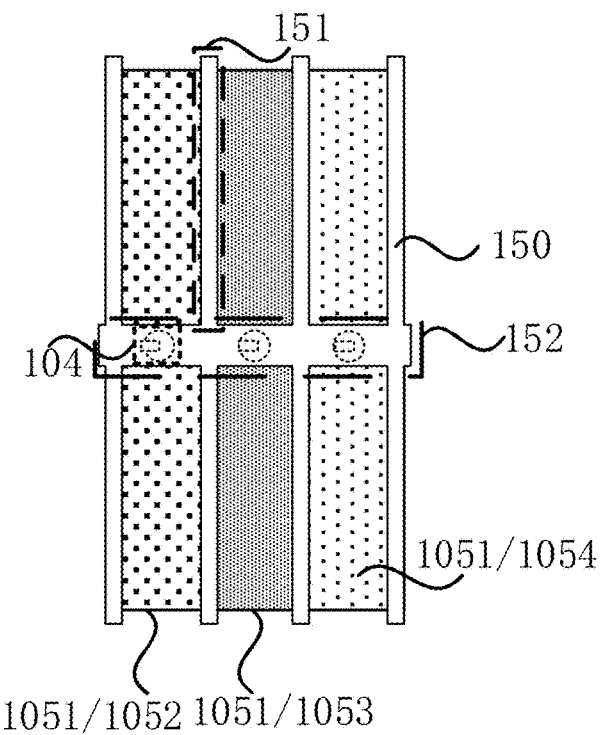
FIG. 34 is a top view of a color-resist layer according to an embodiment of the present disclosure.

FIG. 34 is a top view of a color-resist layer according to an embodiment of the present disclosure. As shown in FIGS. 33 and 34, in some embodiments, the array substrate 100 further includes a light-shielding layer 150 located on the side of the color-resist layer 105 facing away from the substrate 101, and the light-shielding layer 150 covers the signal lead-out structure 104.

The light-shielding layer 150 is located on the side of the color-resist layer 105 facing away from the substrate 101, and the color-resist layer 105 includes multiple color-resist blocks 1051. The color-resist blocks 1051 may include red color-resist blocks 1052, green color-resist blocks 1053, and blue color-resist blocks 1054. The distance between color-resist blocks 1051 of different colors is a thin line width 151, and the distance between color-resist blocks 1051 of the same color is a thick line width 152. The light-shielding layer 150 may be located at the thin line width 151 between color-resist blocks 1051 of different colors or may be located at the thick line width 152 between color-resist blocks 1051 of the same color, which is not limited in embodiments of the present disclosure. In a case where the light-shielding layer 150 is located at the thick line width 152 between color-resist blocks 1051 of the same color, the light-shielding layer 150 covers the signal lead-out structure 104. The light-shielding layer 150 is used to cover the gaps between the signal lead-out structure 104 and adjacent red color-resist blocks 1052, the gaps between the signal lead-out structure 104 and adjacent green color-resist blocks 1053, and the gaps between the signal lead-out structure 104 and adjacent blue color-resist blocks 1054, thus reducing the light leakage of metal wires.

In some embodiments, with further reference to FIGS. 2 and 33, the first electrode 106 includes an electrode body 1061, and the electrode body 1061 is electrically connected to the signal lead-out wire 1042; or the first electrode includes an electrode body 1061 and an electrode bridging structure 1062, and the electrode bridging structure 1062 is electrically connected to the signal lead-out wire 1042 and the electrode body 1061 separately.

As shown in FIG. 2, the first electrode 106 includes the electrode body 1061, the electrode body 1061 may be a pixel electrode, and the first electrode 106 is electrically connected to the output electrode 103 through the signal lead-out wire 1042. As shown in FIG. 33, to avoid the problem of deep drilling between the first electrode 106 and a respective driver circuit 102, the first electrode 106 includes the electrode body 1061 and the electrode bridging structure 1062, and the electrode bridging structure 1062 is electrically connected to the signal lead-out wire 1042 and the electrode body 1061 separately, thus improving the stability of the connection between the electrode body 1061 and the signal lead-out wire 1042 and reducing the difficulty of the preparation process.

Embodiments of the present disclosure further provide a method for preparing an array substrate, or that is to say, the array substrate provided in the preceding embodiments can be prepared using the method for preparing an array substrate. Thus, the method for preparing an array substrate also has the beneficial effects of the array substrate. Same reference can be made to the above explanation of the array substrate and are not repeated hereinafter.

Figure 35:
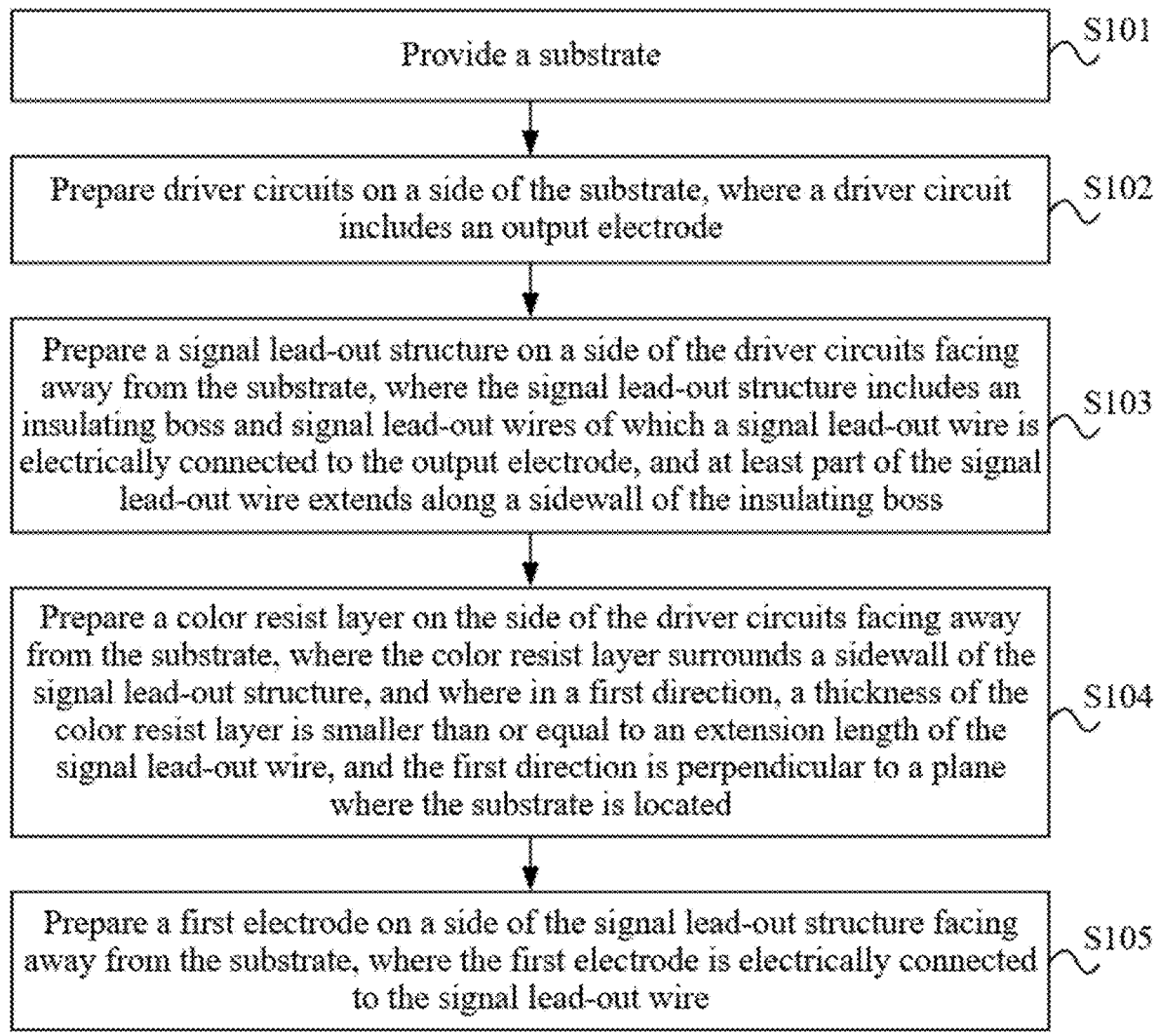
FIG. 35 is a flowchart of a method for preparing an array substrate according to an embodiment of the present disclosure.

For example, FIG. 35 is a flowchart of a method for preparing an array substrate according to an embodiment of the present disclosure. Referring to FIG. 35, the method for preparing an array substrate includes the following S101-S105.

In S101, a substrate is provided.

The substrate may be a rigid substrate or a flexible substrate, the material of the rigid substrate may be glass or a silicon wafer, and the material of the flexible substrate may be ultra-thin glass, metal foil, or polymeric plastic material.

In S102, driver circuits are prepared on a side of the substrate, and the driver circuit includes an output electrode.

In S103, a signal lead-out structure is prepared on a side of the driver circuits facing away from the substrate, and the signal lead-out structure includes an insulating boss and signal lead-out wires. The signal lead-out wire is electrically connected to the output electrode, and at least part of the signal lead-out wire extends along a sidewall of the insulating boss.

In S104, a color-resist layer is prepared on the side of the driver circuits facing away from the substrate, and the color-resist layer surrounds a sidewall of the signal lead-out structure. In the first direction, the thickness of the color-resist layer is less than or equal to the extension length of the signal lead-out wire, and the first direction is perpendicular to a plane where the substrate is located.

The signal lead-out structure is first prepared, and then the color-resist layer is arranged to surround the sidewall of the signal lead-out structure, so that the process of drilling via-holes in the color-resist layer is omitted, thus facilitating the amelioration of problems such as difficulty to drill via-holes on the color-resist layer, color-resist residues in the via-holes and the like, and improving the production yield.

In S105, a first electrode is prepared on a side of the signal lead-out structure facing away from the substrate, and the first electrode is electrically connected to the signal lead-out wire.

The first electrode and the output electrode are electrically connected through the signal lead-out structure, thus ensuring that the drive signal outputted from the driver circuit is normally transmitted to the first electrode, thereby ensuring the display effect.

According to the method for preparing an array substrate provided by the embodiment of the present disclosure, the signal lead-out structure is first prepared, and then the color-resist layer is prepared. In such preparation process, the signal lead-out structure is arranged to include the insulating boss and the signal lead-out wires, at least part of the signal lead-out wire extends along the sidewall of the insulating boss, and thus the electrical connection between the output electrode of the driver circuit and the first electrode is achieved, that is, the electrical connection between the output electrode and the first electrode is achieved without through a via-hole in the color-resist layer. The preparation method does not need to drill via-holes in the color-resist layer, and the preparation process is simple. The display is not affected by residues of color-resist in the via-holes, and the problem of wire breakage of metal is not caused by the excessive depth of the via-holes, thereby ensuring the normal display of the display panel.

Figure 36:
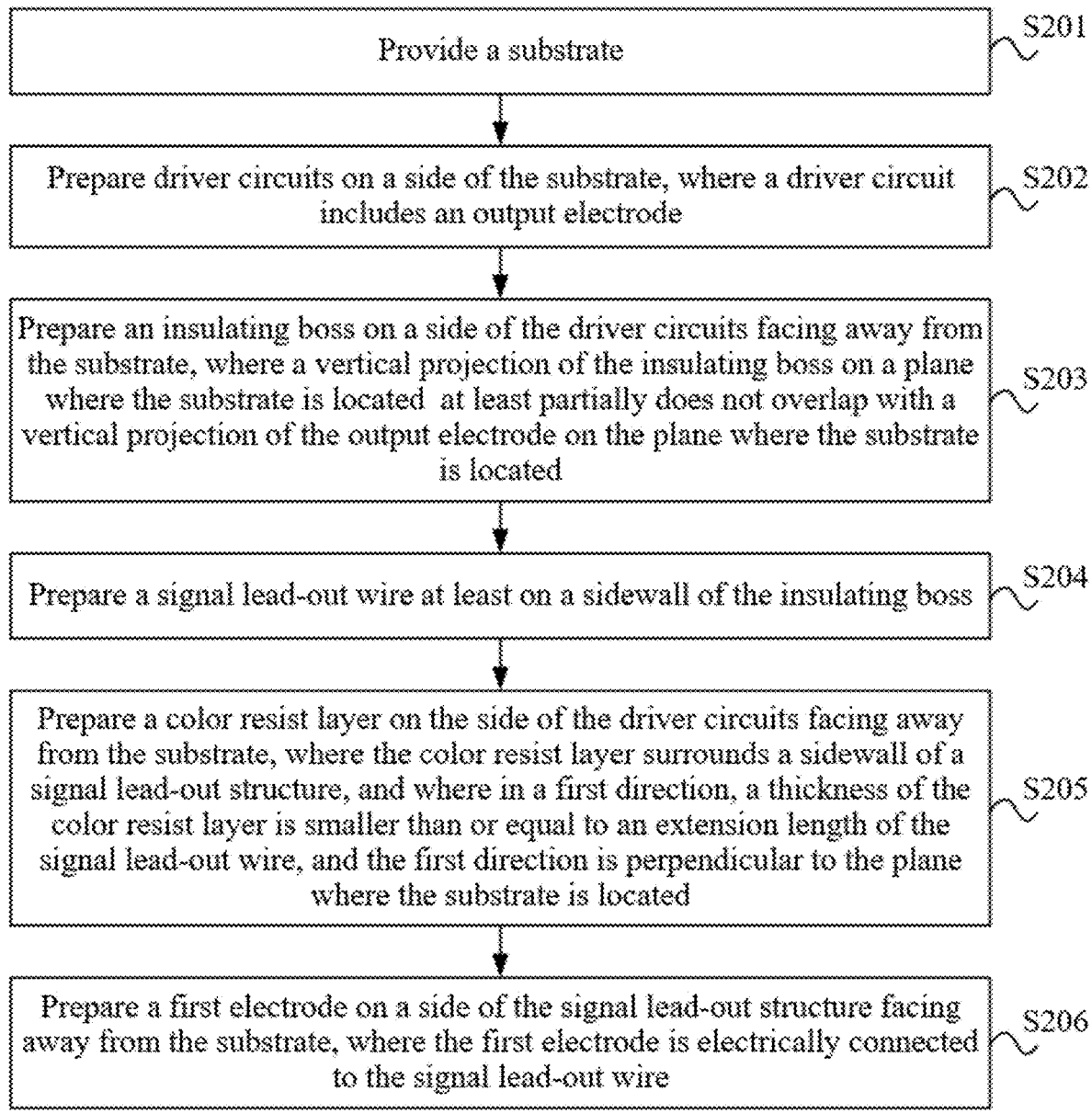
FIG. 36 is another flowchart of a method for preparing an array substrate according to an embodiment of the present disclosure.

FIG. 36 is another flowchart of a method for preparing an array substrate according to an embodiment of the present disclosure. Referring to FIG. 36, the method for preparing an array substrate includes the following S201-S206.

In S201, a substrate is provided.

In S202, driver circuits are prepared on a side of the substrate, and the driver circuit includes an output electrode.

In S203, an insulating boss is prepared on a side of the driver circuits facing away from the substrate, and the vertical projection of the insulating boss on a plane where the substrate is located at least partially does not overlap with the vertical projection of the output electrode on the plane where the substrate is located.

In S204, signal lead-out wires are prepared at least on a sidewall of the insulating boss.

A signal lead-out structure includes the insulating boss and the signal lead-out wires, and the vertical projection of the insulating boss on the plane where the substrate is located at least partially does not overlap with the vertical projection of the output electrode on the plane where the substrate is located, that is, at least part of the output electrode is exposed from the insulating boss. In this manner, the electrical connection between the signal lead-out wire and the output electrode is easy to be implemented. At least part of the signal lead-out wire extends along the sidewall of the insulating boss, thus avoiding the risk of wire breakage of the signal lead-out wire.

In S205, a color-resist layer is prepared on the side of the driver circuits facing away from the substrate, and the color-resist layer surrounds a sidewall of the signal lead-out structure. In the first direction, the thickness of the color-resist layer is less than or equal to the extension length of the signal lead-out wire, and the first direction is perpendicular to the plane where the substrate is located.

In S206, a first electrode is prepared on a side of the signal lead-out structure facing away from the substrate, and the first electrode is electrically connected to the signal lead-out wire.

According to the method for preparing an array substrate provided by the embodiments of the present disclosure, the vertical projection of the insulating boss on the plane where the substrate is located at least partially does not overlap with the vertical projection of the output electrode on the plane where the substrate is located, so that at least part of the output electrode are exposed from the insulating boss, thereby avoiding complex wires of the electrical connection between the signal lead-out wire and the output electrode and reducing the risk of wire breakage.

Figure 37:
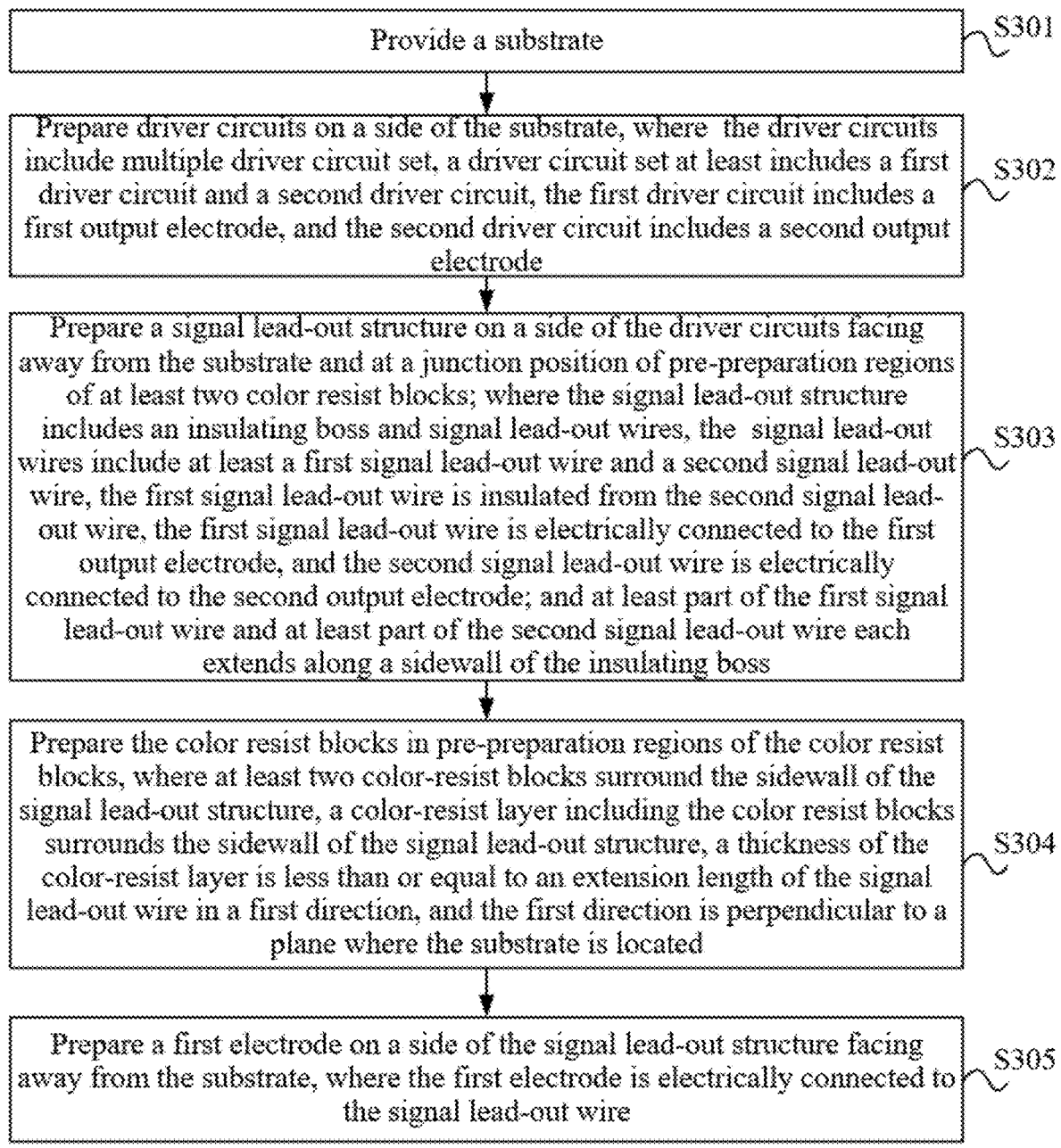
FIG. 37 is another flowchart of a method for preparing an array substrate according to an embodiment of the present disclosure.

FIG. 37 is another flowchart of a method for preparing an array substrate according to an embodiment of the present disclosure. Referring to FIG. 37, in some embodiments, the color-resist layer includes multiple color-resist blocks; the driver circuits include multiple driver circuit sets, and each driver circuit set includes at least a first driver circuit and a second driver circuit; and the first driver circuit includes a first output electrode, and the second driver circuit includes a second output electrode.

The method for preparing an array substrate includes the following S301-S305.

In S301, a substrate is provided.

In S302, driver circuits are prepared on a side of the substrate, where the driver circuits include multiple driver circuit set, a driver circuit set at least includes a first driver circuit and a second driver circuit, the first driver circuit includes a first output electrode, and the second driver circuit includes a second output electrode.

In S303, a signal lead-out structure is prepared on a side of the driver circuits facing away from the substrate and at a joint position of pre-preparation regions of at least two color-resist blocks; where the signal lead-out structure includes an insulating boss and signal lead-out wires, the signal lead-out wires include at least a first signal lead-out wire and a second signal lead-out wire, the first signal lead-out wire is insulated from the second signal lead-out wire, the first signal lead-out wire is electrically connected to the first output electrode, and the second signal lead-out wire is electrically connected to the second output electrode; and at least part of the first signal lead-out wire and at least part of the second signal lead-out wire each extends along a sidewall of the insulating boss.

The signal lead-out wires include the first signal lead-out wire and the second signal lead-out wire which are insulated from each other, so that signal lead-out wires are electrically connected to driver circuits, respectively, thus achieving the normal transmission of drive signals.

In S304, the color-resist blocks are prepared in pre-preparation regions of the color-resist blocks, where at least two color-resist blocks surround the sidewall of the signal lead-out structure, a color-resist layer including the color-resist blocks surrounds the sidewall of the signal lead-out structure, a thickness of the color-resist layer is less than or equal to an extension length of the signal lead-out wire in a first direction, and the first direction is perpendicular to a plane where the substrate is located.

The color-resist blocks may include red color-resist blocks, green color-resist blocks, and blue color-resist blocks. The order of preparation may be selected according to the actual preparing requirements and is not limited in the embodiments of the present disclosure. The thickness of the color-resist layer is less than or equal to the extension length of the signal lead-out wires, thus avoiding via-hole drilling at the color-resist layer and improving the production yield.

In S305, a first electrode is prepared on a side of the signal lead-out structure facing away from the substrate, and the first electrode is electrically connected to the signal lead-out wire.

According to the method for preparing an array substrate provided by the embodiment of the present disclosure, at least two color-resist blocks surround the signal lead-out structure, and the color-resist layer surrounds the sidewall of the signal lead-out structure. In this manner, drilling via-holes are avoided, and the difficulty of the preparation is reduced. Meanwhile, one signal lead-out structure can correspond to multiple color-resist blocks, thereby reducing the number of the signal lead-out structures needs to be provided, and effectively improving the display aperture ratio of the display panel.

Figure 38:
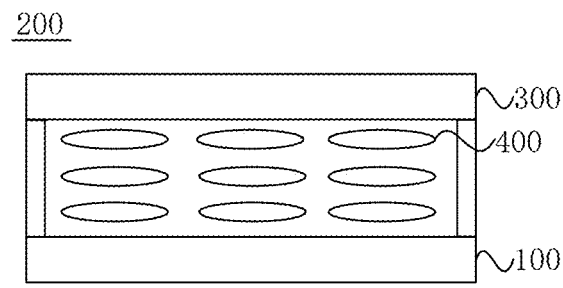
FIG. 38 is a structural diagram of a display panel according to an embodiment of the present disclosure.

Embodiments of the present disclosure further provide a display panel, and FIG. 38 is a structural diagram of a display panel according to an embodiment of the present disclosure. Referring to FIG. 38, the display panel 200 includes an array substrate 100 and further includes an opposing substrate 300 disposed opposite to the array substrate 100, and a display dielectric layer 400 is disposed between the array substrate 100 and the opposing substrate 300. The display panel includes the array substrate provided in the above embodiments, and therefore, the display panel provided by the embodiment of the present disclosure also has the beneficial effects described in the above embodiments, which are not repeated herein.

Figure 39:
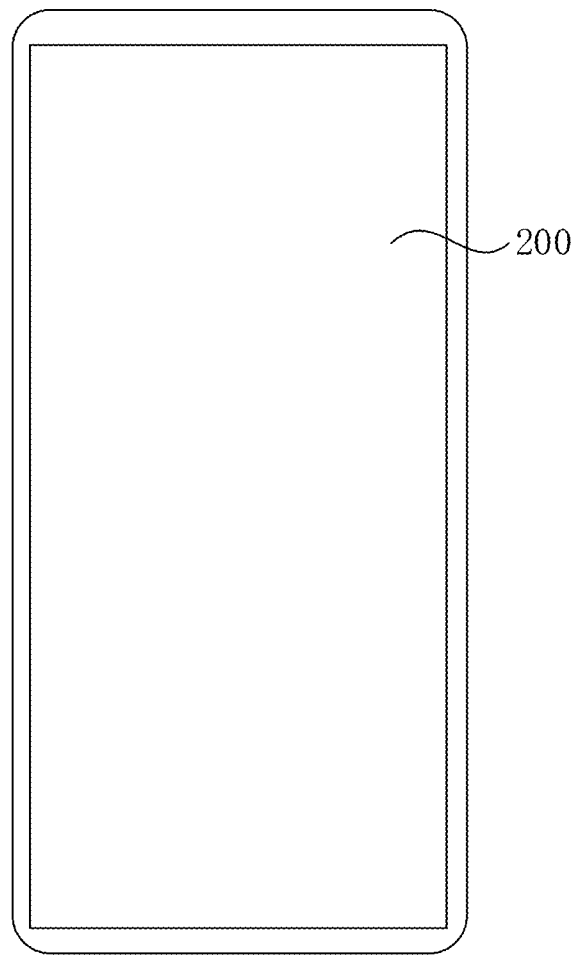
FIG. 39 is a structural diagram of a display device according to an embodiment of the present disclosure.

Embodiments of the present disclosure further provide a display device. FIG. 39 is a structural diagram of a display device according to an embodiment of the present disclosure. As shown in FIG. 39, the display device includes the display panel 200 in the above-mentioned embodiment. The display device includes the display panel described in any embodiment of the present disclosure. Therefore, the display device according to the embodiment of the present disclosure has corresponding effects of the display panel according to the embodiment of the present disclosure, which are not repeated herein. In an example, the display device may be a mobile phone, a computer, a smart wearable device (for example, a smart watch), an in-vehicle display device, and other electronic devices, which is not limited in the embodiments of the present disclosure.

What is claimed is:

1. An array substrate, comprising:
   a substrate;
   driver circuits located on a side of the substrate, wherein a driver circuit of the driver circuits comprises an output electrode;
   a signal lead-out structure, wherein the signal lead-out structure is located on a side of the driver circuits facing away from the substrate, the signal lead-out structure comprises an insulating boss and signal lead-out wires, a signal lead-out wire of the signal lead-out wires is electrically connected to the output electrode, and at least part of the signal lead-out wire extends along a sidewall of the insulating boss;
   a color-resist layer, wherein the color-resist layer is located on the side of the driver circuits facing away from the substrate, and the color-resist layer surrounds a sidewall of the signal lead-out structure, and wherein in a first direction, a thickness of the color-resist layer is less than or equal to an extension length of the signal lead-out wire, and the first direction is perpendicular to a plane where the substrate is located; and
   a first electrode, wherein the first electrode is located on a side of the signal lead-out structure facing away from the substrate, and the first electrode is electrically connected to the signal lead-out wire.

2. The array substrate according to claim 1, wherein the color-resist layer comprises a plurality of color-resist blocks, and at least one color-resist block of the plurality of color-resist blocks contacts the sidewall of the signal lead-out structure.

3. The array substrate according to claim 2, wherein at least two color-resist blocks of the plurality of color-resist blocks surround the sidewall of the signal lead-out structure;
   wherein the driver circuits comprise a plurality of driver circuit sets, a driver circuit set of the plurality of driver circuit sets comprises a first driver circuit and a second driver circuit, and a number of driver circuits in the driver circuit set is the same as a number of the at least two color-resist blocks surrounding the sidewall of the signal lead-out structure;
   wherein the first driver circuit comprises a first output electrode, and the second driver circuit comprises a second output electrode;
   wherein the signal lead-out wires comprise a first signal lead-out wire and a second signal lead-out wire, and the first signal lead-out wire is insulated from the second signal lead-out wire; and
   wherein the first signal lead-out wire is electrically connected to the first output electrode, and the second signal lead-out wire is electrically connected to the second output electrode.

4. The array substrate according to claim 3, wherein the plurality of driver circuit sets are disposed around the signal lead-out structure.

5. The array substrate according to claim 4, wherein the plurality of color-resist blocks are arranged in a matrix, the plurality of color-resist blocks comprise a plurality of color-resist columns, and a first color-resist gap exists between two adjacent color-resist columns of the plurality of color-resist columns;
   wherein the array substrate further comprises a plurality of data signal line sets, a data signal line set of the plurality of data signal line sets comprises a first data signal line and a second data signal line, the first data signal line is electrically connected to the first driver circuit, and the second data signal line is electrically connected to the second driver circuit;
   wherein a vertical projection of the first data signal line on the plane where the substrate is located and a vertical projection of the second data signal line on the plane where the substrate is located overlap vertical projections of different first color-resist gaps on the plane where the substrate is located, respectively; and
   wherein the first data signal line further comprises a first data connection line, and the first driver circuit is electrically connected to the first data signal line via the first data connection line, or the second data signal line further comprises a first data connection line, and the second driver circuit is electrically connected to the second data signal line via the first data connection line.

6. The array substrate according to claim 4, wherein the plurality of color-resist blocks are arranged in a matrix, the plurality of color-resist blocks comprise a plurality of color-resist columns, and a first color-resist gap exists between two adjacent color-resist columns of the plurality of color-resist columns;
   wherein the array substrate further comprises a plurality of data signal line sets, a data signal line set of the plurality of data signal line sets comprises a first data signal line and a second data signal line, the first data signal line is electrically connected to the first driver circuit, and the second data signal line is electrically connected to the second driver circuit; and
   wherein a vertical projection of the first data signal line on the plane where the substrate is located and a vertical projection of the second data signal line on the plane where the substrate is located overlap with a vertical projection of a same first color-resist gap on the plane where the substrate is located.

7. The array substrate according to claim 6, wherein the first data signal line and the second data signal line are disposed in different layers;
   wherein the first data signal line is located on a side of the color-resist layer facing to the substrate, and the second data signal line is located on a side of the color-resist layer facing away from the substrate;
   wherein the second data signal line further comprises a second data connection line, the second data signal line is electrically connected to the second driver circuit via the second data connection line, and the second data connection line extends along a sidewall of the insulating boss; and
   wherein the insulating boss comprises a coned boss structure, or the sidewall of the insulating boss comprises a plurality of sub-sidewalls and at least one of the plurality of sub-sidewalls comprises a curved surface.

8. The array substrate according to claim 4, wherein the plurality of color-resist blocks are arranged in a matrix, the plurality of color-resist blocks comprise a plurality of color-resist rows, and a second color-resist gap exists between two adjacent color-resist rows of the plurality of color-resist rows;
   wherein the array substrate further comprises a plurality of scan signal line sets, a scan signal line set of the plurality of scan signal line sets comprises a first scan signal line and a second scan signal line, the first scan signal line is electrically connected to the first driver circuit, and the second scan signal line is electrically connected to the second driver circuit;
   wherein a vertical projection of the first scan signal line on the plane where the substrate is located and a vertical projection of the second scan signal line on the plane where the substrate is located overlap with vertical projections of different second color-resist gaps on the plane where the substrate is located, respectively; and wherein the first scan signal line further comprises a first scan connection line, and the first driver circuit is electrically connected to the first scan signal line via the first scan connection line; or the second scan signal line further comprises a first scan connection line, and the second driver circuit is electrically connected to the second scan signal line via the first scan connection line.

9. The array substrate according to claim 4, wherein the plurality of color-resist blocks are arranged in a matrix, the plurality of color-resist blocks comprise a plurality of color-resist rows, and a second color-resist gap exists between two adjacent color-resist rows;

wherein the array substrate further comprises a plurality of scan signal line sets, a scan signal line set of the plurality of scan signal line sets comprises a first scan signal line and a second scan signal line, the first scan signal line is electrically connected to the first driver circuit, and the second scan signal line is electrically connected to the second driver circuit; and wherein a vertical projection of the first scan signal line on the plane where the substrate is located and a vertical projection of the second scan signal line on the plane where the substrate is located overlap with a vertical projection of a same second color-resist gap on the plane where the substrate is located.

10. The array substrate according to claim 3, wherein the driver circuits are arranged in an array;

wherein the signal lead-out wire comprises a first lead portion and a second lead portion which are connected; and wherein the first lead portion extends along a sidewall of the insulating boss, and the second lead portion is disposed in a same layer with the output electrode and is electrically connected to the output electrode.

11. The array substrate according to claim 3, wherein the sidewall of the insulating boss comprises a plurality of sub-sidewalls;

wherein the plurality of sub-sidewalls comprise a first sub-sidewall, a second sub-sidewall, and a third sub-sidewall, and the second sub-sidewall is connected to the first sub-sidewall and the third sub-sidewall separately; and wherein at least part of the first signal lead-out wire extends along the first sub-sidewall, and at least part of the second signal lead-out wire extends along the third sub-sidewall.

12. The array substrate according to claim 1, wherein the sidewall of the insulating boss comprises a plurality of sub-sidewalls; and wherein the signal lead-out wire covers at least one of the plurality of sub-sidewalls.

13. The array substrate according to claim 1, wherein the insulating boss comprises a first boss section end-surface and a second boss section end-surface which are disposed sequentially in the first direction, and the first boss section end-surface is located on a side of the second boss section end-surface facing to the substrate; and wherein a vertical projection of the first boss section end-surface on the plane where the substrate is located covers a vertical projection of the second boss section end-surface on the plane where the substrate is located.

14. The array substrate according to claim 1, wherein the array substrate further comprises a planarization layer which is disposed between a film where the driver circuits are located and a film where the color-resist layer is located; and wherein the insulating boss and the planarization layer are disposed in a same layer; and wherein the array substrate further comprises a light-shielding layer which is located on a side of the color-resist layer facing away from the substrate; and wherein the light-shielding layer covers the signal lead-out structure.

15. The array substrate according to claim 1, wherein the first electrode comprises an electrode body, and the electrode body is electrically connected to the signal lead-out wire; or wherein the first electrode comprises an electrode body and an electrode bridging structure, and the electrode bridging structure is electrically connected to the signal lead-out wire and the electrode body separately.

16. A display panel, comprising the array substrate according to claim 1.

17. A display device, comprising the display panel according to claim 16.

18. A method for preparing an array substrate, comprising:

providing a substrate;

preparing driver circuits on a side of the substrate, wherein a driver circuit of the driver circuits comprises an output electrode;

preparing a signal lead-out structure on a side of the driver circuits facing away from the substrate, wherein the signal lead-out structure comprises an insulating boss and signal lead-out wires, a signal lead-out wire of the signal lead-out wires is electrically connected to the output electrode, and at least part of the signal lead-out wire extends along a sidewall of the insulating boss;

preparing a color-resist layer on the side of the driver circuits facing away from the substrate, wherein the color-resist layer surrounds a sidewall of the signal lead-out structure, and wherein in a first direction, a thickness of the color-resist layer is less than or equal to an extension length of the signal lead-out wire, and the first direction is perpendicular to a plane where the substrate is located; and preparing a first electrode on a side of the signal lead-out structure facing away from the substrate, wherein the first electrode is electrically connected to the signal lead-out wire.

19. The method according to claim 18, wherein the preparing the signal lead-out structure on the side of the driver circuits facing away from the substrate comprises:

preparing the insulating boss on the side of the driver circuits facing away from the substrate, wherein a vertical projection of the insulating boss on a plane where the substrate is located at least partially does not overlap with a vertical projection of the output electrode on the plane where the substrate is located; and preparing the signal lead-out wire at least on the sidewall of the insulating boss.

20. The method according to claim 18, wherein the color-resist layer comprises a plurality of color-resist blocks;

wherein the driver circuits comprise a plurality of driver circuit sets, and a driver circuit set of the plurality of driver circuit sets comprises a first driver circuit and a second driver circuit;

wherein the first driver circuit comprises a first output electrode, and the second driver circuit comprises a second output electrode; and wherein the preparing the signal lead-out structure on the side of the driver circuits facing away from the substrate comprises:

preparing the signal lead-out structure on the side of the driver circuits facing away from the substrate and at a joint position of pre-preparation regions of at least two color-resist blocks of the plurality of color-resist blocks, wherein the signal lead-out wires comprises a first signal lead-out wire and a second signal lead-out wire, the first signal lead-out wire is insulated from the second signal lead-out wire, the first signal lead-out wire is electrically connected to the first output electrode, and the second signal lead-out wire is electrically connected to the second output electrode; and wherein the preparing the color-resist layer on the side of the driver circuits facing away from the substrate comprises:

preparing color-resist blocks in pre-preparation regions of the color-resist blocks of the plurality of color-resist blocks, wherein at least two color-resist blocks of the plurality of color-resist blocks surround the sidewall of the signal lead-out structure.

\* \* \* \* \*